(12) United States Patent
Milano et al.

(10) Patent No.: US 10,247,758 B2
(45) Date of Patent: Apr. 2, 2019

(54) CURRENT SENSOR

(71) Applicant: ALLEGRO MICROSYSTEMS, LLC, Manchester, NH (US)

(72) Inventors: Shaun D. Milano, Dunbarton, NH (US); Peter Cisar, Lenzkirch (DE); Stefan Kranz, Lenzkirch (DE); Stephan Schurt, Friedenweiler (DE)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 295 days.

(21) Appl. No.: 15/231,133

(22) Filed: Aug. 8, 2016

(65) Prior Publication Data
US 2018/0038897 A1    Feb. 8, 2018

(51) Int. Cl.
G01R 33/36    (2006.01)
G01R 15/18    (2006.01)
G01R 15/20    (2006.01)

(52) U.S. Cl.
CPC ......... G01R 15/183 (2013.01); G01R 15/185 (2013.01); G01R 15/202 (2013.01); G01R 15/205 (2013.01)

(58) Field of Classification Search
CPC ... G01R 15/183; G01R 15/185; G01R 15/202
USPC ....................................................... 324/127
See application file for complete search history.

(56) References Cited

U.S. PATENT DOCUMENTS

| 3,012,196 A | 12/1961 | Greibach |
| 4,675,255 A | 6/1987 | Pfeifer et al. |
| 5,343,184 A | 8/1994 | Matsui et al. |
| 5,418,514 A | 5/1995 | Smith et al. |
| 5,825,175 A | 10/1998 | Selcuk |
| 6,005,383 A | 12/1999 | Savary et al. |
| 6,040,688 A | 3/2000 | Strubin |

(Continued)

FOREIGN PATENT DOCUMENTS

| DE | 102012104348 | 11/2013 |
| EP | 2 682 762 | 1/2014 |

OTHER PUBLICATIONS

Extended Search Report dated Jan. 5, 2018 for European Application No. 17184228.9; 7 pages.
(Continued)

Primary Examiner — Reena Aurora
(74) Attorney, Agent, or Firm — Daly, Crowley, Mofford & Durkee, LLP

(57) ABSTRACT

A current sensor includes a ferromagnetic core having a substantially central opening for receiving a current conductor and at least two gaps portions, each of the gap portions having an associated gap spacing. A detector of the current sensor includes at least one first sensing element disposed in a first one of the gap portions and configured to generate a respective first magnetic field signal in response to a first magnetic field generated in the first gap portion in response to a current through the current conductor. The detector also includes at least one second sensing element disposed in a second one of the gap portions and configured to generate a respective second magnetic field signal in response to a second magnetic field generated in the second gap portion in response to the current through the conductor. A method of sensing a current through a current conductor is also provided.

20 Claims, 12 Drawing Sheets

(56) References Cited

U.S. PATENT DOCUMENTS

| | | |
|---|---|---|
| 6,177,884 B1 | 1/2001 | Hunt et al. |
| 6,323,636 B1 | 11/2001 | Cattaneo et al. |
| 6,388,549 B1 | 5/2002 | Lenhard |
| 6,411,078 B1 | 6/2002 | Nakagawa et al. |
| 6,544,078 B2 | 4/2003 | Palmisano et al. |
| 6,667,685 B2 | 12/2003 | Wasaki et al. |
| 6,686,730 B2 * | 2/2004 | Marasch ............... G01R 15/202 324/117 H |
| 6,717,396 B2 | 4/2004 | Viola |
| 6,756,776 B2 | 6/2004 | Perkinson et al. |
| 6,781,359 B2 | 8/2004 | Stauth et al. |
| 7,265,531 B2 | 9/2007 | Stauth et al. |
| 7,501,808 B2 | 3/2009 | Ishihara et al. |
| 7,936,164 B2 | 5/2011 | Doogue et al. |
| 9,285,437 B2 * | 3/2016 | Rushmer ............... G01R 33/072 |
| 2003/0227285 A1 | 12/2003 | Marasch et al. |
| 2004/0263151 A1 | 12/2004 | Zein et al. |
| 2005/0045359 A1 | 3/2005 | Doogue et al. |
| 2006/0043960 A1 | 3/2006 | Itoh et al. |
| 2006/0105757 A1 * | 5/2006 | Kang .................... G06F 1/1624 455/418 |
| 2006/0152210 A1 | 7/2006 | Mangtani et al. |
| 2006/0175674 A1 | 8/2006 | Taylor et al. |
| 2006/0181263 A1 | 8/2006 | Doogue et al. |
| 2006/0219436 A1 | 10/2006 | Taylor et al. |
| 2006/0255797 A1 | 11/2006 | Taylor et al. |
| 2007/0247146 A1 | 10/2007 | Stauth et al. |
| 2007/0252577 A1 | 11/2007 | Preusse |
| 2008/0048643 A1 | 2/2008 | Delevoye et al. |
| 2008/0094162 A1 | 4/2008 | Schaeffer et al. |
| 2013/0169267 A1 | 7/2013 | Miyakoshi et al. |
| 2015/0022198 A1 * | 1/2015 | David .................. G01D 5/2013 324/251 |
| 2015/0022199 A1 | 1/2015 | Mito et al. |

OTHER PUBLICATIONS http://www.tdk.co.jp/tefe02/e9a15-zcat.pdf, TDK, Clamp Filters for Cable, Sep. 25, 2006, 4 pages.

Chucheng Xiao, Lingyin Zhao, Tadashi Asada, W.G. Odendaal and J.D. Van Wyk, "An Overview of Integratable Current Sensor Technologies", Center for Power Electronics Systems, Virginia Polytechnic Institute and State University, Blacksburg, VA, IEEE, 2003, 8 pages.

Michael Doogue, Richard Dickinson, Andreas P. Friedrich and William P. Taylor, "An Integrated Hall Effect Based Current Sensor", Proc. Sensor 2005 12$^{th}$ International Conference, vol. II, Munich, Germany, May 2005; 6 pages.

Andreas P. Friedrich, "Low Noise, High Bandwidth Linear Hall Effect Sensors for Analog Position and Current Measurements", Proc. Sensor Conference 2007, Nurnberg, Germany, May 2007, 6 pages.

Milano, Application Note "Advanced Hall-Effect Linear Current Sensor IC Enables High BW Sensing in Hybrid Electric Vehicles and other High Current Sensing Applications", Mar. 27, 2015, 4 pages.

Allegro Datasheet A1363 "Low Noise, High Precision, Programmable Linear Hall Effect Sensor IC With Advanced Temperature Compensation and High Bandwidth (120 kHz) Analog Output", Nov. 16, 2012, 30 pages.

Allegro Datasheet A1366 "Low Noise, High Precision, Factory-Programmed Linear Hall Effect Sensor IC With Advanced Temperature Compensation and High Bandwidth (120 kHz) Analog Output", May 1, 2014, 22 pages.

Restriction Requirement dated Jun. 8, 2009 for U.S. Appl. No. 12/167,681; 6 pages.

Response to Restriction Requirement dated Jun. 22, 2009 for U.S. Appl. No. 12/167,681; 1 page.

Office Action dated Aug. 24, 2009 for U.S. Appl. No. 12/167,681; 15 pages.

Response to Office Action dated Oct. 27, 2009 for U.S. Appl. No. 12/167,681; 14 pages.

Final Office Action dated Jan. 11, 2010 for U.S. Appl. No. 12/167,681; 15 pages.

Response to Office Action dated Feb. 1, 2010 for U.S. Appl. No. 12/167,681; 12 pages.

Office Action dated Mar. 10, 2010 for U.S. Appl. No. 12/167,681; 11 pages.

Response to Office Action dated Apr. 26, 2010 for U.S. Appl. No. 12/167,681; 13 pages.

Final Office Action dated Jun. 11, 2010 for U.S. Appl. No. 12/167,681; 12 pages.

Response to Office Action dated Jul. 13, 2010 for U.S. Appl. No. 12/167,681; 14 pages.

Office Action dated Aug. 20, 2010 for U.S. Appl. No. 12/167,681; 14 pages.

Response to Office Action dated Sep. 24, 2010 for U.S. Appl. No. 12/167,681; 15 pages.

Notice of Allowance dated Oct. 18, 2010 for U.S. Appl. No. 12/167,681; 14 pages.

Notice of Allowance dated Sep. 12, 2018 for U.S. Appl. No. 15/805,616; 12 pages.

Response to the Extended European Search Report dated Jan. 5, 2018 for European Application No. 17184228.9 as filed on Aug. 14, 2018; 11 pages.

* cited by examiner

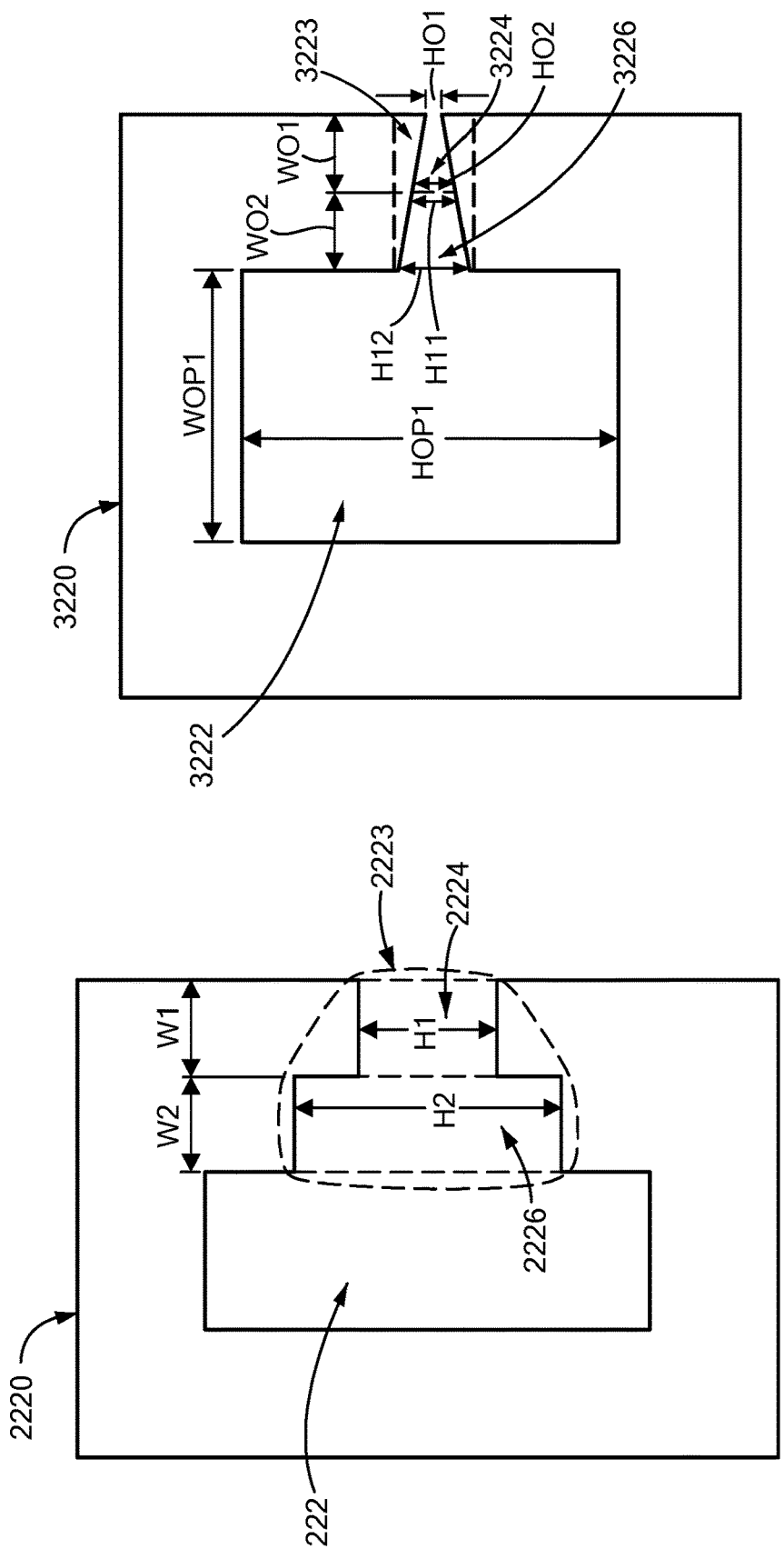

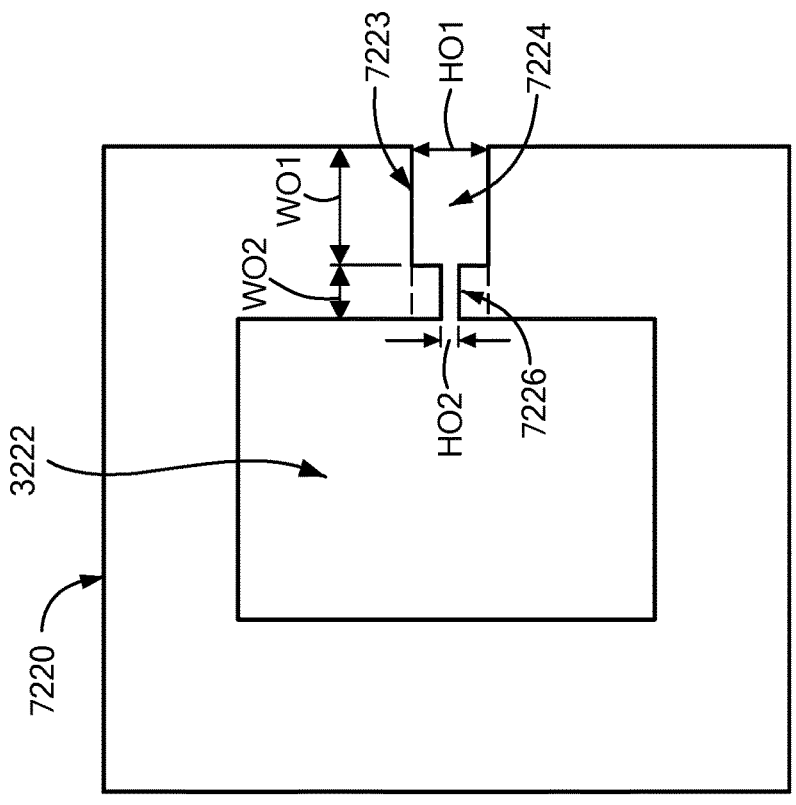
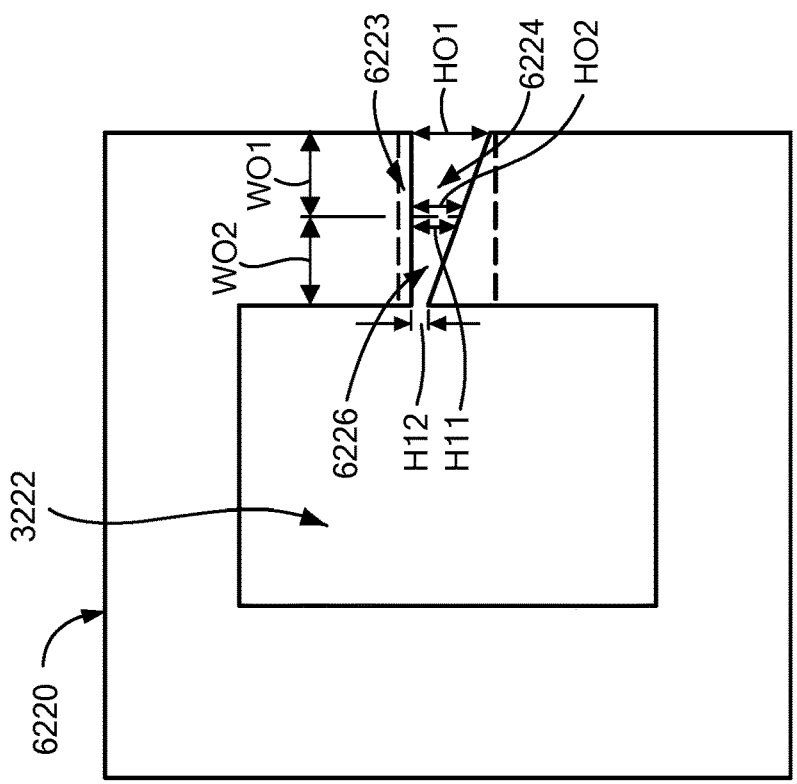
FIG. 2G
FIG. 2F

CURRENT SENSOR

CROSS REFERENCE TO RELATED APPLICATIONS

Not Applicable.

STATEMENT REGARDING FEDERALLY SPONSORED RESEARCH

Not Applicable.

FIELD

This disclosure relates generally to current sensors, and more particularly, to a current sensor including a ferromagnetic core.

BACKGROUND

As is known, some current sensors include a magnetic field sensor to sense a current through a current conductor. A magnetic field generated in response to the current through the current conductor may be detected by one or more magnetic field sensing elements, such as Hall effect elements and/or magnetoresistance elements, which provide respective signals (i.e., magnetic field signals) proportional to the detected magnetic field. A ferromagnetic core can be used to concentrate the magnetic field for detection by the magnetic field sensing element.

SUMMARY

Described herein are concepts, systems, circuits and techniques related to a current sensor and a method of sensing a current through a current conductor with such a current sensor. In one aspect of the concepts described herein, a current sensor includes a ferromagnetic core having a substantially central opening for receiving a current conductor and at least two gaps portions, each of the gap portions having an associated gap spacing. The current sensor also includes a detector including at least one first magnetic field sensing element disposed in a first one of the gap portions and configured to generate a respective first magnetic field signal in response to a first magnetic field generated in the first gap portion in response to a current through the current conductor. The detector also includes at least one second magnetic field sensing element disposed in a second one of the gap portions and configured to generate a respective second magnetic field signal in response to a second magnetic field generated in the second gap portion in response to the current through the conductor. The first magnetic field has a magnitude greater than the second magnetic field.

The current sensor may include one or more of the following features individually or in combination with other features. The at least one first magnetic field sensing element may be configured to sense a first current level range through the current conductor and the at least one second magnetic field sensing element may be configured to sense a second, higher current level range through the current conductor. A spacing between the at least one first magnetic field sensing element and the at least one second magnetic field sensing element may be based, at least in part, on a spacing between the first and second gap portions. The detector may include a first circuit portion responsive to the first magnetic field signal and a second, substantially identical circuit portion responsive to the second magnetic field signal. A sensitivity of the first circuit portion may be calibrated based on the spacing of the first gap portion and a sensitivity of the second circuit portion may be calibrated based on the spacing of the second gap portion to be lower than the sensitivity of the first circuit portion. A lateral cross-section of a gap comprising the gap portions may include a step shape or a ramp shape.

The detector may include circuitry responsive to the first magnetic field signal and to the second magnetic field signal to provide an output signal of the current sensor indicative of the current through the current conductor. The at least one first magnetic field sensing element and the at least one second magnetic field sensing element may include one or more Hall effect elements. The at least one first magnetic field sensing element and the at least one second magnetic field sensing element may include one or more of an anisotropic magnetoresistance (AMR) element, a giant magnetoresistance (GMR) element, a magnetic tunnel junction (MTJ) element and a tunneling magnetoresistance (TMR) element. One of the at least one first magnetic field sensing element and the at least one second magnetic field sensing element may include one or more Hall effect elements, and the other one of the at least one first magnetic field sensing element and the at least one second magnetic field sensing element may include one or more magnetoresistance elements.

The at least one first magnetic field sensing element and the at least one second magnetic field sensing element may be supported by a single die. The at least one first magnetic field sensing element may be supported by a first die and the at least one second magnetic field sensing element may be supported by a second, different die. The first die and the second die may be provided in a single integrated circuit package. The first die and the second die may be provided in separate integrated circuit packages. The detector may include at least one third magnetic field sensing element disposed between the at least one first magnetic field sensing element and the at least one second magnetic field sensing element and configured to generate a third magnetic field signal. The detector may include a first circuit portion responsive to the first and third magnetic field signals to generate a first differential magnetic field signal, and a second circuit portion responsive to the second and third magnetic field signals to generate a second differential magnetic field signal.

In another aspect of the concepts described herein, a method of sensing a current through a current conductor disposed through a substantially central opening of a ferromagnetic core includes placing a first magnetic field sensing element in a first gap portion of the ferromagnetic core having a first gap spacing, and placing a second magnetic field sensing element in a second gap portion of the ferromagnetic core having a second gap spacing, larger than the first gap spacing. A first magnetic field signal is generated by the first magnetic field sensing element in response to a first magnetic field in the first gap portion, and a second magnetic field signal is generated by the second magnetic field sensing element in response to a second magnetic field in the second gap portion.

The method also includes generating a current sensor output signal with a first circuit portion in response to the first magnetic field signal when the current through the current conductor is within a first current level range, and generating the current sensor output signal with a second circuit portion in response to the second magnetic field signal when the current through the current conductor is within a second, higher current level range.

The method may include one or more of the following features either individually or in combination with other features. A sensitivity of the first circuit portion may be greater than a sensitivity of the second circuit portion. The first magnetic field sensing element may be provided on a first die and the second magnetic field sensing element may be provided on a second, different die. The method may include providing the first and second die in a single integrated circuit package or providing the first and second die in separate integrated circuit packages.

BRIEF DESCRIPTION OF THE DRAWINGS

The foregoing features of the disclosure, as well as the disclosure itself may be more fully understood from the following detailed description of the drawings, in which:

FIG. 2B is a side view of a third example configuration of a ferromagnetic core according to the disclosure;

FIG. 2C is a side view of a fourth example configuration of a ferromagnetic core according to the disclosure;

FIG. 2F is a side view of a seventh example configuration of a ferromagnetic core according to the disclosure;

FIG. 2G is a side view of an eighth example configuration of a ferromagnetic core according to the disclosure;

DETAILED DESCRIPTION

Figure 1:
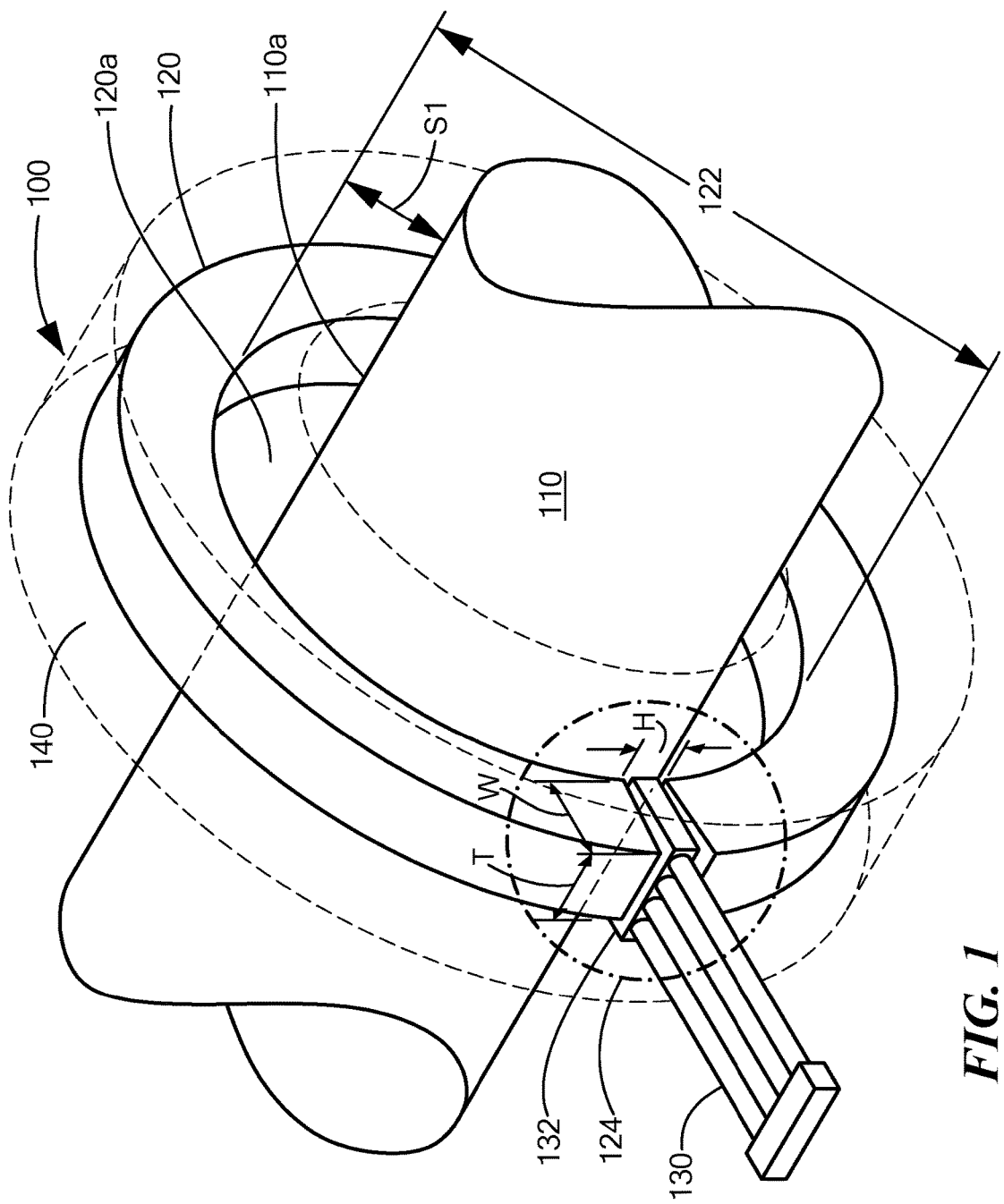
FIG. 1 shows an example prior art current sensor for sensing current through a current conductor.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

For convenience, certain introductory concepts and terms used in the specification are collected here.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

The term "magnetic field sensing element" can be used to describe more than one physical semiconductor structure (for example, more than one magnetoresistance element yoke) coupled together in such a way as to generate one or more magnetic field signals in response to a magnetic field. Thus, individual magnetic field sensing elements shown in figures below can instead each be comprised of more than one magnetic field sensing element.

As used herein, the term "magnetic field sensor" is used to describe a circuit that uses one or more magnetic field sensing elements, generally in combination with other components and/or circuits. Magnetic field sensors are used in a variety of applications, including, but not limited to, a current sensor that senses a magnetic field generated by a current carried by a current-carrying conductor.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit.

While examples below describe current sensors for sensing a current through specific current conductors (e.g., current-conducting wires or busbars), it should be appreciated that the current sensors disclosed herein may be found suitable for sensing a current through a variety of current conductor types.

Additionally, while currents sensors including ferromagnetic cores having a specific number of gap portions (e.g., two gap portions) are described in several examples below, such is discussed to promote simplicity, clarity and understanding in the description of the concepts, systems, circuits and techniques sought to be protected herein and is not intended to be, and should not be construed as, limiting. The current sensors disclosed herein may, for example, be implemented using ferromagnetic cores having more than the specific number of gap portions.

Further, it should be appreciated that, as used herein, relational terms, such as "first," "second," "top," "bottom," "left," "right," and the like, may be used to distinguish one element or portion(s) of an element (e.g., a first gap portion of a ferromagnetic core) from another element or portion(s) of the element (e.g., a second gap portion of a ferromagnetic core) without necessarily requiring or implying any physical or logical relationship or order between such elements.

Referring to FIG. 1, an example prior art current sensor 100 for sensing a current through a current conductor 110 includes a ferromagnetic core 120 and a detector 130. The ferromagnetic core 120 (i.e., a magnetic concentrator) has an opening 122 for receiving the current conductor 110 (e.g., a current-conducting wire) and a single gap portion, or air gap, or simply gap 124, in which at least a portion of the detector 130 (e.g., at least one magnetic field sensing element 132 of the detector 130, as will be discussed) is disposed. Additionally, one or more of the current conductor 110, the ferromagnetic core 120 and the detector 130 may be surrounded by and/or coupled to an enclosure 140 (e.g., application specific housing).

The ferromagnetic core 120, which is shown as taking the form of a substantially circular, ring-shaped core, may comprise a variety of magnetic field concentrating materials including, for example, a ferrite material, laminated steel, and an iron alloy. These materials are typically selected based on a variety of factors, including permeability, resistivity, and/or cost of the material. For example, iron alloys such as ferrosilicon (FeSi) or ferronickel (FeNi) are commonly used materials for ferromagnetic cores in power applications because they exhibit a substantially high permeability.

Additionally, the ferromagnetic core 120 typically has dimensions selected based on dimensions associated with the application, dimensions of the current conductor 110 received in the opening 122, and a single range of current levels through the conductor 110 to be sensed by the current sensor 100. For example, the ferromagnetic core 120 may have dimensions selected such that a predetermined distance S1 exists between a surface 110a (i.e., an outer surface) of the current conductor 110 and a surface 120a (i.e., an inner surface) of the ferromagnetic core 120 in the opening 122. Distance S1 may be selected to achieve a certain minimum distance between surface 110a of current conductor 110 and surface 120a of core 120 in order to prevent the core 120 from saturating at high currents. For example, distance S1 may be between about three millimeters and about four millimeters. Magnetic fields generated in the core 120 are typically concentrated in the gap 124.

The gap 124 is formed in a select portion of the ferromagnetic core 120 and has dimensions that, along with the core material, establish a particular magnetic coupling in the gap 124. In the illustrated embodiment, the gap 124 takes the form of a rectangular prism having an associated width W (defined by the difference between an inner diameter of the core 120 and an outer diameter of the core 120), thickness T, and air gap length, or height H. The core diameter and cross section (T*W) are generally selected to be as large as an application allows as the larger the diameter and the larger the cross section, the higher the core saturation point. The air gap height H is a significant dimension as it directly affects the gain of the magnetic concentration (i.e., impact on the resulting magnetic flux density in the gap 124). In particular, for a constant cross-sectional area, the smaller the air gap height H, the higher the concentration gain associated with the gap.

The detector 130, which may be provided as a magnetic field sensor, for example, includes at least one magnetic field sensing element 132 disposed in the gap 124. The at least one magnetic field sensing element 132 may take the form of a Hall effect element, for example, and may be configured to generate a magnetic field signal at an output in response to an applied magnetic field (e.g., a magnetic field as may be generated in the gap 124 in response to current through the current conductor 110, as will be discussed). The detector 130 may also include circuitry (i.e., processing circuitry) coupled to the at least one magnetic field sensing element 132 and configured to provide an output signal of the current sensor 100 indicative of the current through the current conductor 110. Dimensions of the gap 124 may be adjusted based on package thickness of the detector 130.

The above-described prior art current sensor 100 is configured to sense a current through the current conductor 110. In particular, a magnetic field can be generated in the ferromagnetic core 120 in response to a current through the current conductor 110 and the ferromagnetic core 120 may concentrate the generated magnetic field in the gap 124 (i.e., proximate to the detector 130). Additionally, the at least one magnetic field sensing element 132 can generate a magnetic field signal in response to the magnetic field in the gap 124 and circuitry responsive to the magnetic field signal can provide an output signal of the current sensor 100 indicative of the current through the current conductor 110. For example, a magnitude of the output signal may be substantially proportional to a magnitude of the current through the current conductor 110.

The prior art current sensor 100 provides an output signal (i.e., a current sensor output signal) indicative of the current through the current conductor for a single current level range. Thus, in electronic circuits that require sensing of a plurality of different current level ranges (e.g., a first current level range and a second current level range greater than the first current level range), the current sensor 100 alone may be insufficient. Such electronic circuits typically require a plurality of current sensors for sensing a respective plurality of current level ranges. The use of multiple current sensors can be costly, both in terms of material costs and space.

Figure 2A:
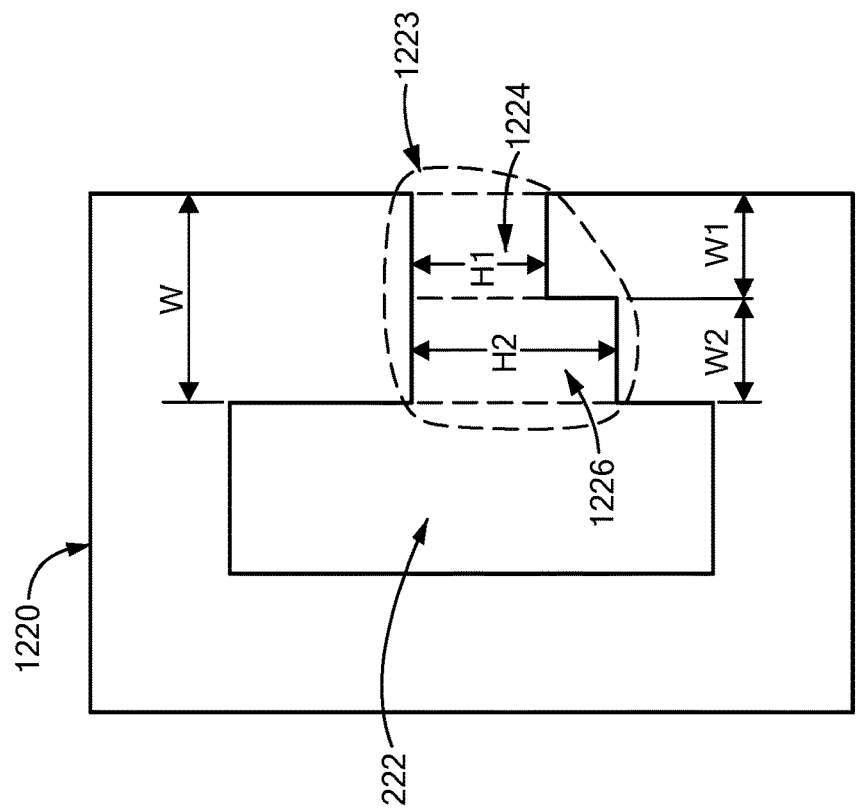
FIG. 2A is a side view of a second example configuration of a ferromagnetic core according to the disclosure.
Figure 2:
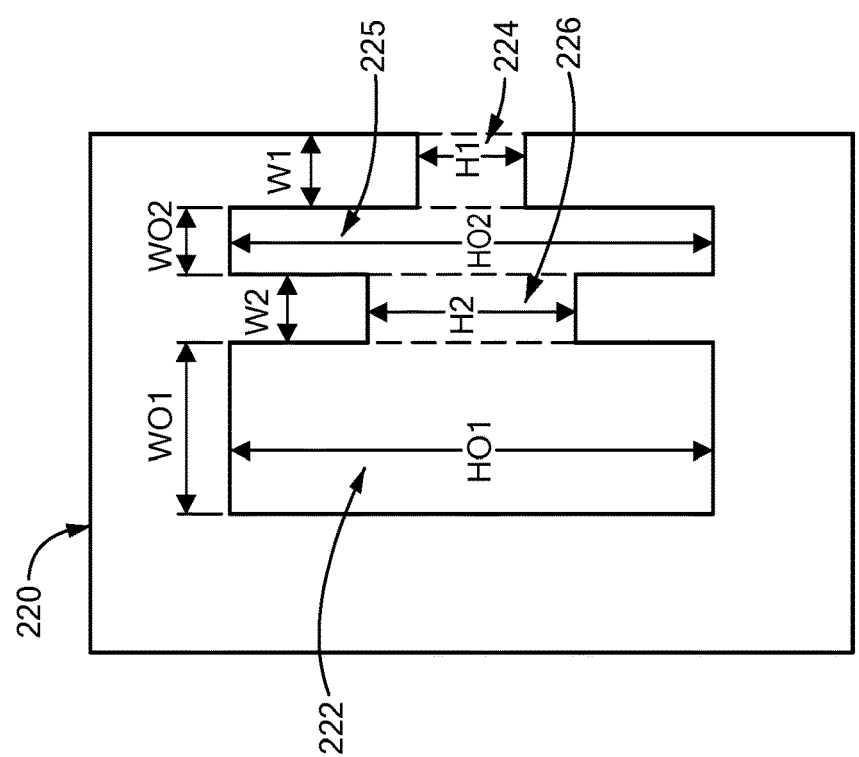
FIG. 2 is a side view of a first example configuration of a ferromagnetic core as may be provided in a current sensor according to the disclosure.

Referring to FIGS. 2-2G, example ferromagnetic cores (e.g., 220, shown in FIG. 2) as may be provided in a current sensor according to the disclosure are shown. In contrast to ferromagnetic core 120 shown in FIG. 1, each of the ferromagnetic cores of FIGS. 2-2G has at least two gaps or gap portions (e.g., 224 and 226, shown in FIG. 2) for sensing a corresponding plurality of current level ranges. In order to sense a current through a current conductor (e.g., 110, shown in FIG. 1) received in an opening (e.g., 222) of the ferromagnetic cores of FIGS. 2-2G, for example, at least one first magnetic field sensing element is positioned in a first gap portion (e.g., 224) of the ferromagnetic core having a first gap spacing and at least one second magnetic field sensing element is positioned in a second gap portion (e.g., 226) of the ferromagnetic core having a second gap spacing, different than the first gap spacing.

Depending on the current level range of the current through the current conductor (e.g., first or second current level ranges), an output signal of the current sensor may be indicative of either a first magnetic field signal generated by the at least one first magnetic field sensing element in response to a first magnetic field generated in the first gap portion or a second magnetic field signal generated by the at least one second magnetic field sensing element in response to a second magnetic field generated in the second gap portion. For example, the current sensor output signal may be generated in response to the first magnetic field signal when the current through the current conductor is within a first current level range (e.g., about 0 mA to about 100 mA) and in response to the second magnetic field signal when the current through the current conductor is within a second, higher current level range (e.g., about 1 A to about 1000 A). Additional aspects of current sensing by current sensors including the ferromagnetic cores of FIGS. 2-2G, for example, will be described further in conjunction with FIGS. 3-3B.

It should be appreciated that the example ferromagnetic cores of FIGS. 2-2G described below are but several of many potential configurations of ferromagnetic cores in accordance with the disclosure. For example, while ferromagnetic cores having a substantially "C" shape are shown in FIGS. 2-2G, it should be appreciated that the ferromagnetic cores may take the form of a variety of different shapes (e.g., depending on the application). Additionally, it should be appreciated that the example at least two gap portions of the ferromagnetic cores described in figures below can be provided in the form of a single gap (e.g., gap 1223, shown in FIG. 2A or gap 3223, shown in FIG. 2C) or as a plurality of distinct gaps (e.g., gap 224, 226, shown in FIG. 2). Further, while the at least two gap portions are shown taking the form of particular shapes (e.g., rectangular prisms) in the figures below, it should be appreciated that the at least two gap portions can take the form of a variety of shapes such as a rectangular prism, a cube, a sphere, an ellipsoid, a cylinder, a cone, a pyramid and the like. Additionally, the gap spacings associated with the respective gap portions, which may affect the magnetic fields in the gap portions, as discussed above, may be based on one or more dimensions (e.g., a width, thickness, and/or height) of the gap portions.

Referring to FIG. 2, a first example ferromagnetic core 220 according to the disclosure has a substantially central opening 222 for receiving a current conductor (e.g., 110, shown in FIG. 1) and first and second distinct gaps, or gap portions 224, 226. First gap portion 224 has a first gap spacing (here, including a respective height H1) and second gap portion 226 has a second gap spacing (here, including a respective height H2), larger than the first gap spacing. The different gap spacing between the first gap portion 224 and the second gap portion 226 may be established by changing one or more dimensions of one gap portion relative to the other. For example, the first and second gap portions 224, 226 may have the same cross-sectional area (e.g., width W and thickness T) but different gap heights H1, H2, as shown. As one example, height H1 may be between about 1.2 millimeters (mm) and about 1.5 mm, and height H2 may be about 5 mm. As another example, the height H1 and height H2 may be selected to be substantially any height (e.g., between about 2 mm and about 10 mm) suitable for current sensing, but are selected such that the height H2 is larger than the height H1 and such that the heights H2 and H1 are substantially larger than package thickness of a detector (e.g., 130, shown in FIG. 2) provided in the first and second gap portions 224, 226.

The first gap spacing and, thus, one or more dimensions of the first gap spacing (e.g., H1), may be selected based, at least in part, on a first current level range to be sensed by the current sensor including the ferromagnetic core 220 (and a first magnetic field to be generated in the first gap portion 224). Additionally, the second gap spacing and, thus, one or more dimensions of the second gap spacing (e.g., H2), may be selected based, at least in part, on a second current level range to be sensed by the current sensor (and a second magnetic field to be generated in the second gap portion 226). The second current level range may, for example, be higher than the first current level range in some embodiments and the second gap spacing may provide for a lower concentration gain than the first gap spacing used for sensing the first current level range. Stated differently, magnetic field detection in the first gap portion 224 can correspond to sensing lower currents and thus, can be referred to as a high resolution position. Additionally, the magnetic field detection in the second gap portion 226 can correspond to sensing higher currents and thus, can be referenced as a low resolution position.

Ferromagnetic core 220 also includes an opening 225 between the first and second gap portions 224, 226 in the illustrated embodiment. Dimensions of the opening 225 (e.g., a height HO2 and/or a width WO2) may, for example, be selected based, at least in part, on the first current level range and the second current level range to be sensed by the current sensor. Dimensions of the opening 225 may also be selected based upon dimensions of the ferromagnetic core 220 and a spacing as may be needed between the first and second gap portions 224, 226 to provide for sensing of the first and second current level ranges by the sensor including the ferromagnetic core 220. For example, dimensions of the opening 225 may be selected to achieve a desired ratio (e.g., two to one, ten to one, one hundred to one, etc.) between the first and second current level ranges to be sensed. Further, dimensions of the opening 222 (e.g., a height HO1 and/or a width WO1) in ferromagnetic core 220 may be selected based, at least in part, on dimensions of the current conductor to be received by the opening 222.

The ferromagnetic core 220 may comprise materials including, but not limited to, a ferrite material, laminated steel, an iron alloy, a Supermalloy, a nickel alloy, a cobalt alloy, and a Permalloy. Additionally, the ferromagnetic core 200 may take the form of a variety of shapes and sizes. For example, the ferromagnetic core 220 may take the form of a "C" shape and have a substantially circular shape or a substantially square or rectangular shape. In one embodiment, the dimensions of the ferromagnetic core 220 and dimensions of the first and second gap portions 224, 226 in the ferromagnetic core 220 are selected based, at least in part, on a magnitude of the first and second current level ranges to be sensed using the ferromagnetic core 220.

The magnitude of the first and second current level ranges to be sensed may, for example, depend on the current sensing application. For example, in a battery monitoring application in an automobile, the first current level range may correspond to a current level range suitable for measuring substantially "small" currents (e.g., leakage currents) when the automobile is off and the second current level range may correspond to a current level range suitable for measuring substantially "large" currents when the automobile is operating. In some embodiments, the ferromagnetic core 220 may include additional gap portions (e.g., third or fourth gap portions) as may be suitable for sensing additional current level ranges (e.g., third or fourth current level ranges).

Additionally, in some embodiments the ferromagnetic core 220 may be surrounded by an enclosure (not shown) which may comprise a material (e.g., a plastic molded material) as may be suitable for a particular current sensing application. For example, in a high temperature/high mechanical stress environment, such as an automotive environment, the enclosure may include an high temperature molding material. Such may, for example, reduce the environmental impact on sensing accuracy by the current sensor including the ferromagnetic core 220.

Referring to FIG. 2A, in which like elements of FIG. 2 are provided having like reference designations, a second example ferromagnetic core 1220 according to the disclosure has an opening 222 for receiving a current conductor and first and second gap portions 1224, 1226 provided in the form a single gap 1223. In one embodiment, ferromagnetic core 1220 functions in a similar manner as core 220 of FIG. 2, providing the ability to sense first and second current level ranges. However, by providing the first and second gap portions 1224, 1226 in the form the single gap 1223, rather than in the form of multiple, distinct gaps (e.g., 224, 226, shown in FIG. 2), dimensions of the core 1220 may be smaller than otherwise would be possible if the core 1220 were to have multiple gaps. Further, costs associated with manufacturing the core 1220 may be less due to the smaller form factor of the core 1220.

A lateral cross-section of the gap 1223, taken through a width of core 1220 (e.g., the dimension from the outer diameter of the core 1220 to the inner diameter of the core 1220), corresponds to a step shape in the illustrated embodiment. First gap portion 1224 has a first gap spacing (here, including a respective height H1) and second gap portion 1226 has a second gap spacing (here, including a respective height H2), larger than the first gap spacing. Similar to ferromagnetic core 200 of FIG. 2, the different gap spacing between the first gap portion 1224 and the second gap portion 1226 may be established by changing one or more dimensions of one gap portion relative to the other. For example, the first and second gap portions 1224, 1226 may have the same cross-sectional area (e.g., width W and thickness T) but different gap heights H1, H2, as shown. It follows that the first and second gap portions 1224, 1226 have different gap spacings and, thus, provide for different concentration gains.

The first gap spacing and, thus, one or more dimensions of the first gap spacing (e.g., H1), may be selected based, at least in part, on a first current level range to be sensed by the current sensor including the ferromagnetic core 1220 (and a first magnetic field to be generated in the first gap portion 1224). Additionally, the second gap spacing and, thus, one or more dimensions of the second gap spacing (e.g., H2), may be selected based, at least in part, on a second current level range to be sensed by the current sensor (and a second magnetic field to be generated in the second gap portion 1226). The second current level range may, for example, be higher than the first current level range in some embodiments and require less magnetic field concentration gain in the second gap portion 1226 than the first current level range in the first gap portion 1224.

With the above arrangement, a first magnetic field may be generated in the first gap portion 1224 in response to a current in the first current level range and a second magnetic field (e.g., a less concentrated magnetic field due to the second, larger gap spacing) may be generated in the second gap portion 1226 in response to a current in the second current level range.

Referring to FIG. 2B, a third example ferromagnetic core 2220 has an opening 222 for receiving a current conductor and first and second gap portions 2224, 2226 provided in the form a single gap 2223. A lateral cross-section of the gap 2223, taken through a width of core 2220 (e.g., the dimension from the outer diameter of the core 2220 to the inner diameter of the core 2220), corresponds to a step shape in the illustrated embodiment. First gap portion 2224 has a first gap spacing (here, including a respective height H1) and second gap portion 2226 has a second gap spacing (here, including a respective height H2), larger than the first gap spacing. It follows that the second gap portion 2226 may provide for less magnetic field concentration gain than the first gap portion 2224 and, thus, may be more suitable for sensing larger currents than first gap portion 2224.

Referring to FIG. 2C, a fourth example ferromagnetic core 3220 has an opening 3222 for receiving a current conductor (e.g., 110, shown in FIG. 1) and first and second gap portions 3224, 3226 provided in the form a single gap 3223. A lateral cross-section of the gap 3223, taken through a width of core 3220 (e.g., the dimension from the outer diameter of the core 3220 to the inner diameter of the core 3220), corresponds to a ramp or wedge shape in the illustrated embodiment. First gap portion 3224, which occupies a first portion of the ramp or wedged shaped gap 3223, has a first gap spacing (here, including a respective first height HO1 and a respective second height HO2). Additionally, second gap portion 3226, which occupies a second portion of the gap 3223, has a second gap spacing (here, including a respective first height H11 and a respective height H12), larger than the first gap spacing. It follows that the second gap portion 3226 may provide for less of a concentration gain than the first gap portion 3224 and, thus, may be more suitable for sensing larger currents than first gap portion 3224. A slope and, thus, one or more dimensions of the gap 3223, may be selected to achieve a desired ratio between first and second current level ranges to be sensed in the first and second gap portions 3224, 3226. The gap slope may also be selected based upon type(s) of sensing elements to be disposed in the first and second gap portions 3224, 3226 and may include consideration of a saturation level associated with the sensing elements. Further, dimensions of the opening 3222 (e.g., a height HOP1 and/or a width WOP1) may be selected based, at least in part, on dimensions of the current conductor to be received by the opening 3222.

Figure 2E:
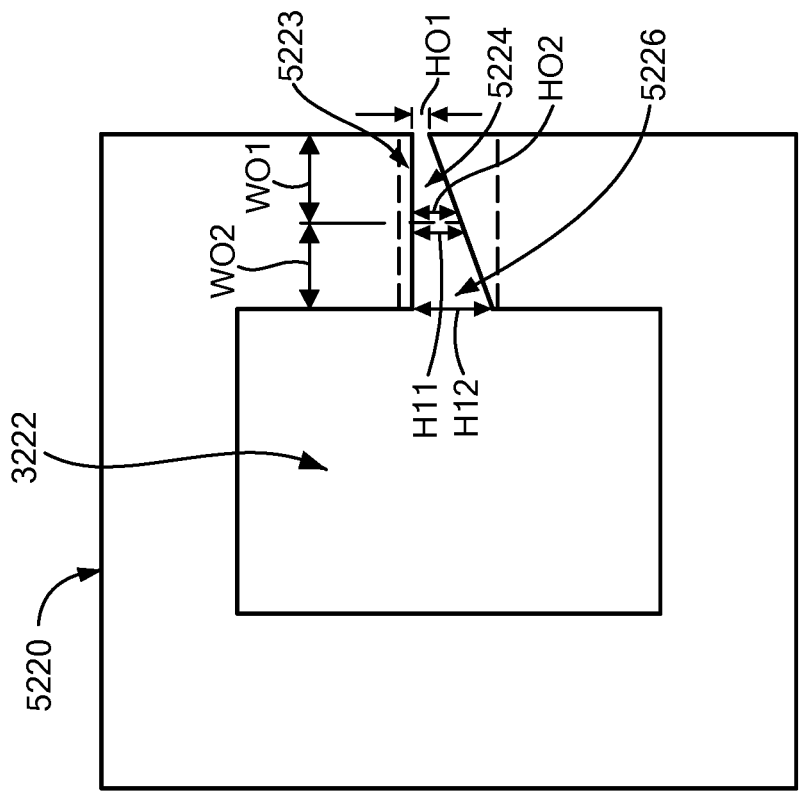
FIG. 2E is a side view of a sixth example configuration of a ferromagnetic core according to the disclosure.
Figure 2D:
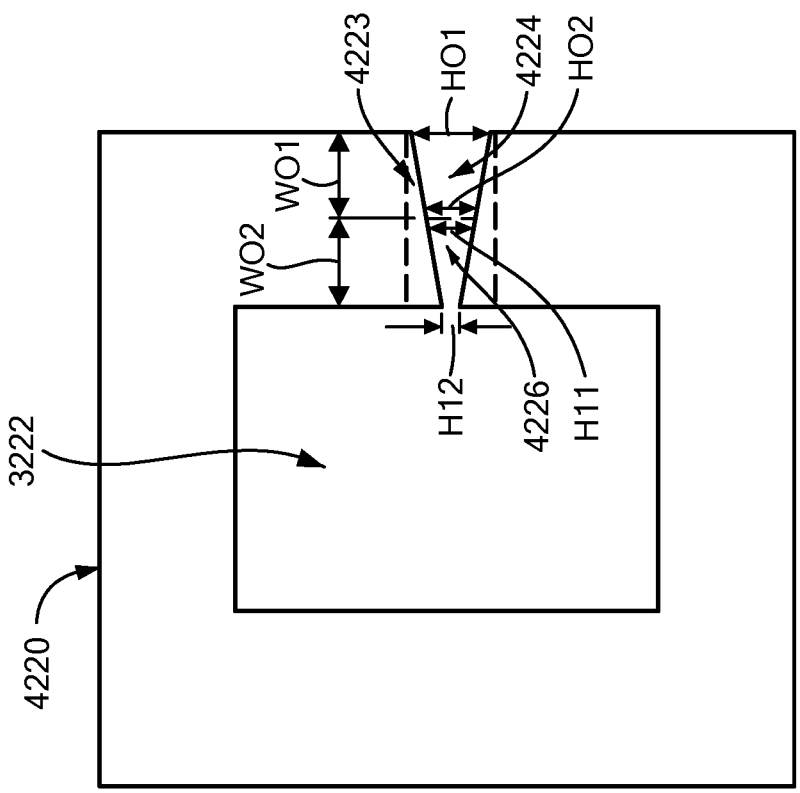
FIG. 2D is a side view of a fifth example configuration of a ferromagnetic core according to the disclosure.

Referring to FIG. 2D, in which like elements of FIG. 2C are provided having like reference designations, a fifth example ferromagnetic core 4220 has opening 3222 and first and second gap portions 4224, 4226 provided in the form a single gap 4223. A lateral cross-section of the gap 4223, taken through a width of core 4220 (e.g., the dimension from the outer diameter of the core 3220 to the inner diameter of the core 4220), corresponds to a ramp or wedge shape in the illustrated embodiment. First gap portion 4224 has a first gap spacing (here, including a respective first height HO1 and a respective second height HO2) and second gap portion 4226 has a second gap spacing (here, including a respective first height H11 and a respective second height H12), smaller than the first gap spacing. It follows that the second gap portion 4226 may provide for more magnetic field concentration gain than the first gap portion 4224 and, thus, may be more suitable for sensing smaller currents than first gap portion 4224.

Referring to FIG. 2E, a sixth example ferromagnetic core 5220 has opening 3222 and first and second gap portions 5224, 5226 provided in the form a single gap 5223. A lateral cross-section of the gap 5223, taken through a width of core 5220 (e.g., the dimension from the outer diameter of the core 5220 to the inner diameter of the core 5220), corresponds to a ramp or wedge shape in the illustrated embodiment. First gap portion 5224 has a first gap spacing (here, including a respective first height HO1 and a respective second height HO2) and second gap portion 5226 has a second gap spacing (here, including a respective first height H11 and a respective second height H12), larger than the first gap spacing. It follows that the second gap portion 5226 may provide for less magnetic field concentration gain than the first gap portion 5224 and, thus, may be more suitable for sensing larger currents than first gap portion 5224.

Referring to FIG. 2F, a seventh example ferromagnetic core 6220 has opening 3222 and first and second gap portions 6224, 6226 provided in the form a single gap 6223. A lateral cross-section of the gap 6223, taken through a width of core 6220 (e.g., the dimension from the outer diameter of the core 6220 to the inner diameter of the core 6220), corresponds to a ramp or wedge shape in the illustrated embodiment. First gap portion 6224 has a first gap spacing (here, including a respective first height HO1 and a respective second height HO2) and second gap portion 6226 has a second gap spacing (here, including a respective first height H11 and a respective second height H12), smaller than the first gap spacing. It follows that the second gap portion 6226 may provide for more magnetic field concentration gain than the first gap portion 6224 and, thus, may be more suitable for sensing smaller currents than first gap portion 6224.

Referring to FIG. 2G, an eighth example ferromagnetic core 7220 has opening 3222 and first and second gap portions 7224, 7226 provided in the form a single gap 7223. A lateral cross-section of the gap 7223, taken through a width of core 7220 (e.g., the dimension from the outer diameter of the core 7220 to the inner diameter of the core 7220), corresponds to a step shape in the illustrated embodiment. First gap portion 7224 has a first gap spacing (here, including a respective height HO1) and second gap portion 7226 has a second gap spacing (here, including a respective height HO2), here both the height and width of the second gap spacing being smaller than like dimensions of the first gap spacing. It follows that the second gap portion 7226 may provide for more magnetic field concentration gain than the first gap portion 7224 and, thus, may be more suitable for sensing smaller currents than first gap portion 7224.

While the gap portions of FIGS. 2A-2G (e.g., 1224, 1226, shown in FIG. 2A) physically "meet" at (i.e., run along) the width (e.g., W, shown in FIG. 2A) of the respective ferromagnetic cores in which they are provided (e.g., 1220, shown in FIG. 2), it should be appreciated that gap portions according to the disclosure may alternatively run along the thickness T of the cores (described below in connection with FIGS. 2H and 2I). As discussed, ferromagnetic cores generally have a width W (defined by the difference between an inner diameter of the core and an outer diameter of the core) and a thickness T (that can be the same as or similar to the thickness T shown in FIG. 1).

Figure 2I:
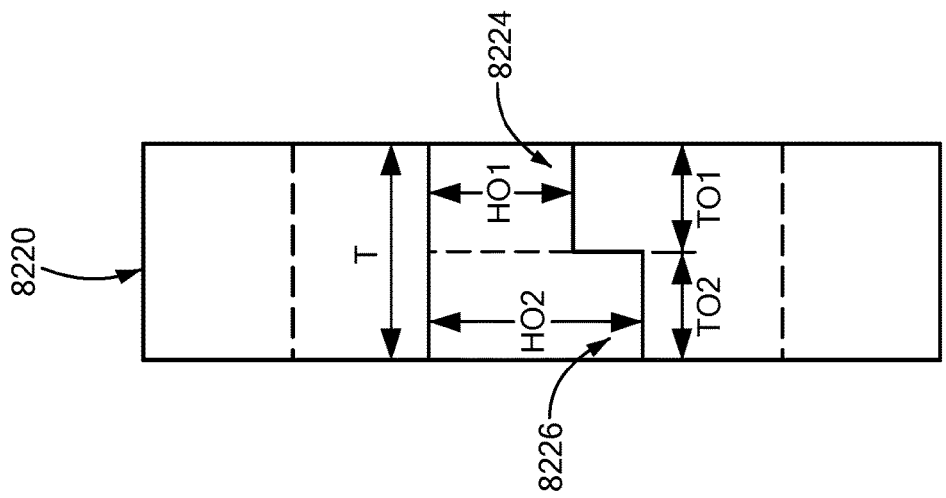
FIG. 2I is a cross-sectional view of the ferromagnetic core of FIG. 2H.
Figure 2H:
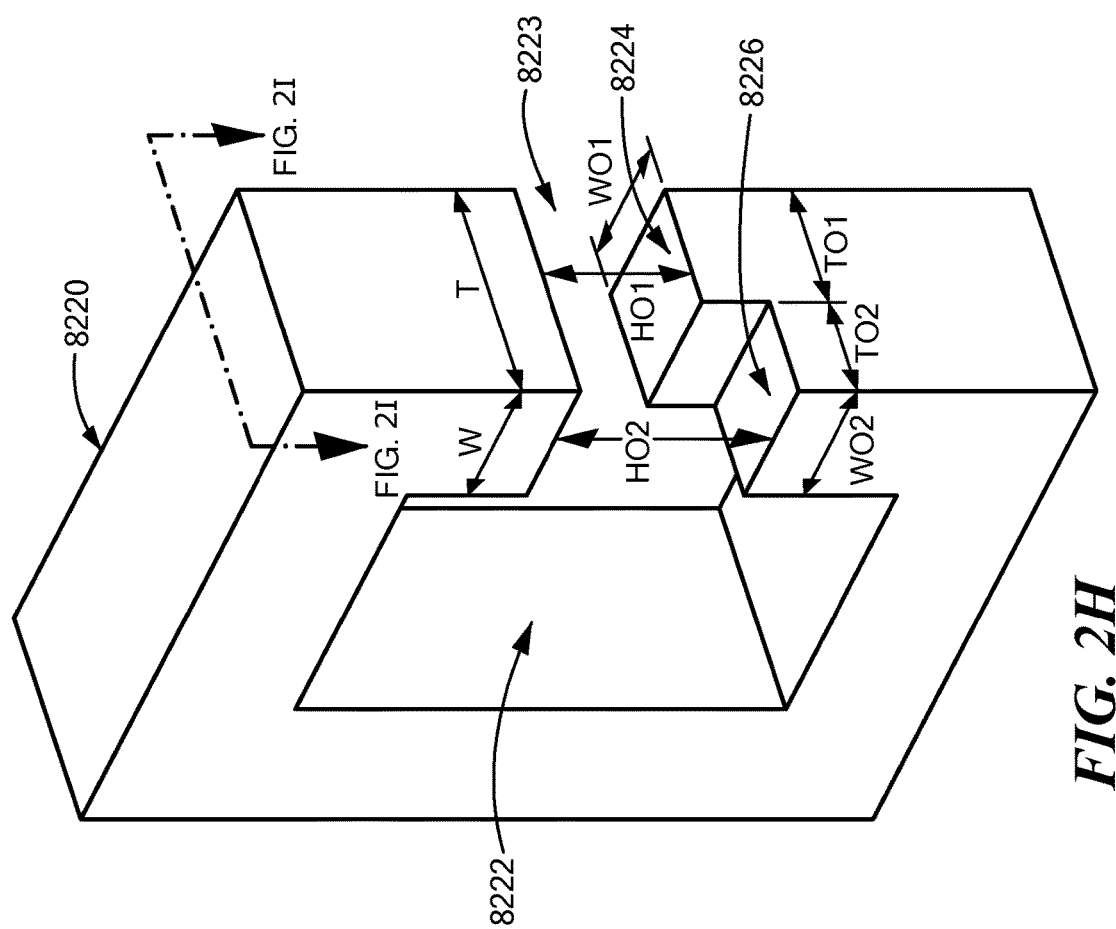
FIG. 2H is a perspective view of a ninth example configuration of a ferromagnetic core according to the disclosure.

Referring to FIG. 2H, an ninth example ferromagnetic core 8220 according to the disclosure has opening 8222 for receiving a current conductor and first and second gap portions 8224, 8226 provided in the form a single gap 8223. Referring also to the cross-sectional view of the ferromagnetic core 8220 shown in FIG. 2I, a lateral cross-section of the gap 8223, taken through a thickness T of core 8220, corresponds to a step shape in the illustrated embodiment.

First gap portion 8224 has a first gap spacing (here, including a respective height HO1) and physically "meets" with second gap portion 8226 along a thickness T of the ferromagnetic core 8220. Second gap portion 8226 has a second gap spacing (here, including a respective height HO2), larger than the first gap spacing. Similar to the ferromagnetic cores of FIGS. 2-2G, the different gap spacing between the first gap portion 8224 and the second gap portion 8226 may be established by changing one or more dimensions of one gap portion relative to the other. For example, the first and second gap portions may have a same width and thickness, but different gap heights HO1, HO2, as shown. As another example, the first and second gap portions may have a same width, but different gap heights H01, H02 and thicknesses T01, T02.

In the illustrated embodiment, with the second gap spacing being larger than the first gap spacing, the second gap portion 8226 may provide for less magnetic field concentration gain than the first gap portion 8224. It follows that the second gap portion 8226 may be more suitable for sensing larger currents and a higher current level range than first gap portion 8224.

With each of the above-described ferromagnetic core arrangements of FIGS. 2-2I, dimensions of first and second gap spacings may be selected based on first and second current level ranges to be sensed by the current sensor including the ferromagnetic cores, so as to achieve a desired magnetic field strength within the gap portions when the respective current levels to be sensed flow through the current conductor received by the core opening (e.g., 222, shown in FIG. 2).

Figure 3A:
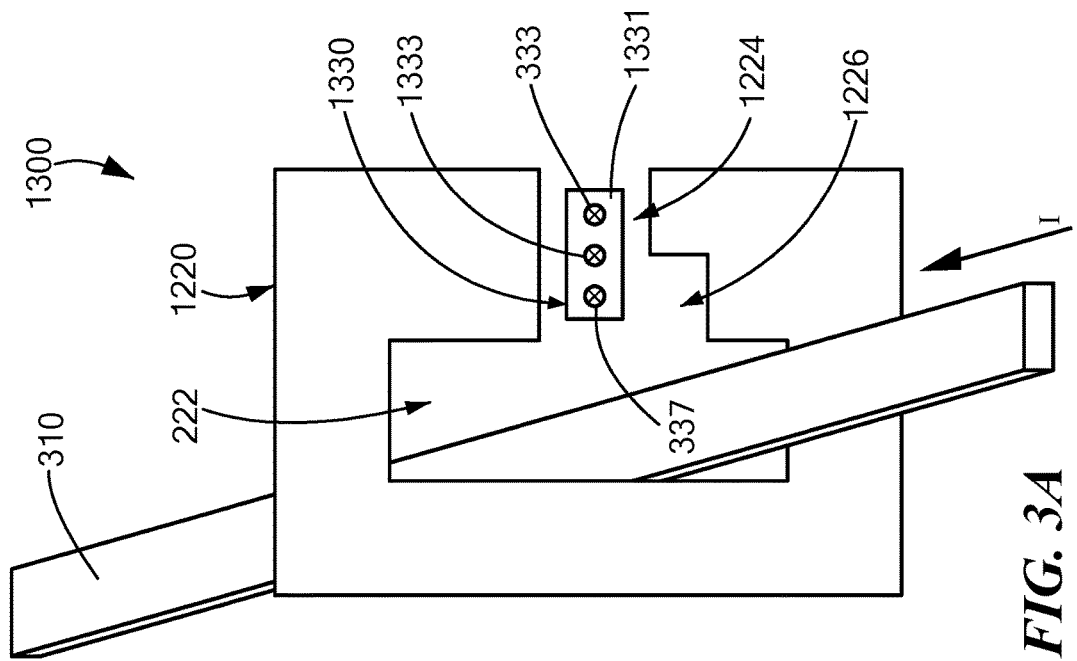
FIG. 3A is a side view of a second example current sensor including the ferromagnetic core of FIG. 2A.
Figure 3:
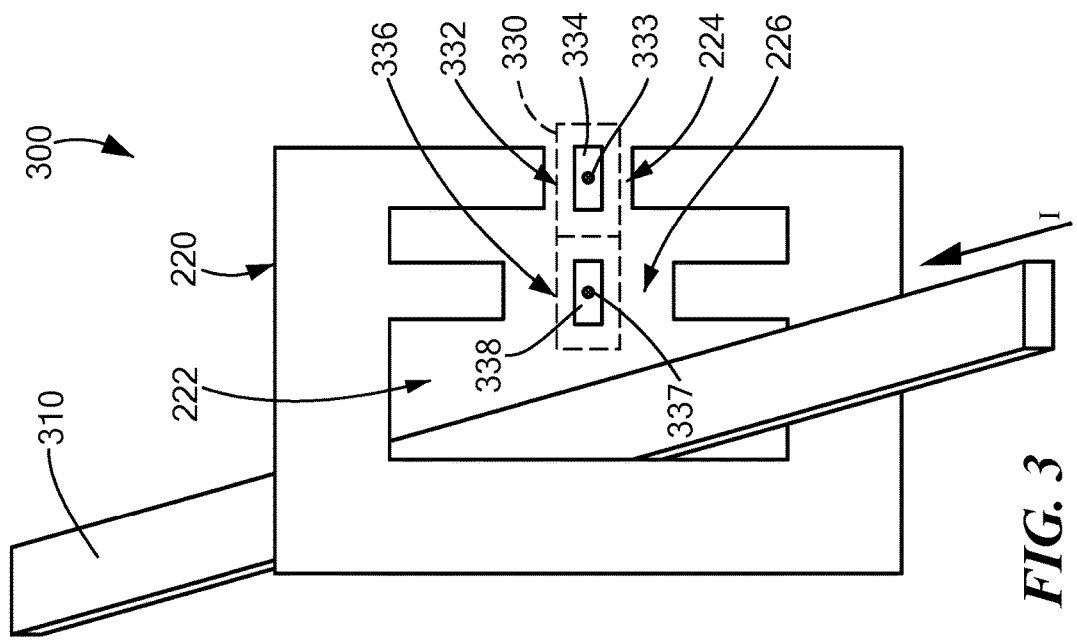
FIG. 3 is a side view of a first example current sensor including the ferromagnetic core of FIG. 2.

Referring to FIG. 3, in which like elements of FIG. 2 are shown having like reference designations, a first example current sensor 300 for sensing a current through a current conductor 310 according to the disclosure includes ferromagnetic core 220 and a detector 330. The current conductor 310 (e.g., a current carrying wire or busbar), which may be the same as or similar to current conductor 110 of FIG. 1, for example, is disposed in opening 222 of the ferromagnetic core 220. Additionally, at least one first magnetic field sensing element 333 in a first detector portion 332 of the detector 330 is disposed in the first gap portion 224 of the ferromagnetic core 220 and at least one second magnetic field sensing element 337 in a second detector portion 336 of the detector 300 is disposed in the second gap portion 226 of the ferromagnetic core 220. A spacing between the at least one first sensing element 333 and the at least one second sensing element 337 may be based, at least in part, on a spacing between the first and second gap portions 224, 226.

In the illustrated embodiment, the first sensing element 333 is supported a first die 334 and the second sensing element 337 is supported by a second die 338. In some embodiments, the first die 334 and the second die 338 are provided in separate integrated circuit packages. In other embodiments, the first and second die 334, 338 may be provided in the same integrated circuit package.

The first sensing element 333 may take the form of a Hall effect element, for example, and may be configured to generate a first magnetic field signal at an output in response to a first magnetic field generated in the first gap portion 224 (e.g., in response to a current I through the current conductor 310). The first magnetic field signal may be received by circuitry (e.g., circuit 510 shown in FIG. 5, as will be discussed) configured to provide an output signal of the current sensor 300 indicative of the current I through the current conductor 310 (e.g., when the current I is within a first current level range).

Additionally, the second sensing element 337 make take the same or a different form as the first sensing element 333 and may be configured to generate a second magnetic field signal at an output in response to a second magnetic field generated in the second gap portion 226 (e.g., in response to the current I through the current conductor 310). The second magnetic field signal may be received by circuitry (e.g., circuit 530 shown in FIG. 5, as will be discussed) configured to provide an output signal of the current sensor 300 indicative of the current I through the current conductor 310 (e.g., when the current I is within a second, higher current level range). A magnitude of the output signals generated by the circuitry may be substantially proportional to magnitudes of the current I through the current conductor 310.

With the above-described arrangement, the current sensor 300 is configured to sense a current through the current conductor 310 within at least two current level ranges (e.g., programmable current level ranges). Thus, in electronic circuits that require sensing of a current through a current conductor for at least first and second current level ranges, the current sensor 300 alone may be sufficient.

The first and second current level ranges may be based, at least in part, on the gap spacings of the first and second gap portions 224, 226. Additionally, the first and second current level ranges may be based, at least in part, on sensitivities of the first and second detector portions 332, 336. For example, the first detector portion 332 may be programmed to have a first sensitivity (e.g., a sensitivity of about 10 mV/Gauss) as may be suitable for sensing a first current level range. Additionally, the second detector portion 336 may be programmed to have a second, lower sensitivity (e.g., a sensitivity of about 1 mV/Gauss) as may be suitable for sensing a second, higher current level range.

Sensitivities of the first and second detector portions 332, 336 may also depend on the type(s) of sensing elements in the first and second detector portions 332, 336 and the sensing element type. For example, the sensing element 333 in first detector portion 332 may take the form of a magnetoresistance element (e.g., a GMR element) and the sensing element 337 in second detector portion 336 may take the form of a Hall element.

The type of sensing elements may also impact the gap spacings of the first and second gap portions. For example, since a GMR element can be more sensitive to magnetic field changes than a comparable Hall element, a gap portion including a GMR element may have a different gap spacing than a like gap portion including a Hall element.

A spacing or position of the first and second sensing elements 333, 337 within or proximate to the first and second gap portions 224, 226 may affect the first and second magnetic fields sensed by the first and second sensing elements 333, 337, respectively, and, thus, the first and second current level ranges sensed by the sensing elements 333, 337. In some embodiments, the spacing or position of the first and second sensing elements 333, 337 within or proximate to the first and second gap portions 224, 226 is based, at least in part, on type(s) of sensing elements in the first and second detector portions 332, 336 and the axes of maximum sensitivity associated with such sensing elements. A GMR element may, for example, have different spacing or position constraints than a comparable Hall element. As one example, it may be acceptable for a GMR element to be disposed or positioned proximate to or just outside a gap portion to maximize a horizontal magnetic field component on the GMR, while it may not be acceptable for a comparable Hall element to be disposed or positioned in a similar manner.

It follows that a sensitivity of the first detector portion 332 (i.e., a first circuit portion) may be adjusted, or calibrated based on the current level range to be sensed, the gap spacing of the first gap portion 224, the spacing of the first sensing element 333 within the first gap portion 224, and/or a sensitivity of the first sensing element 333. Additionally, a sensitivity of the second detector portion 336 (i.e., a second circuit portion) may be calibrated based on the gap spacing of the second gap portion 226, the spacing of the second sensing element 337 within the second gap portion 226, and/or a sensitivity of the second sensing element 337. Further, sensitivities of the detector portions 332, 336 may be calibrated based on mechanical placement tolerances of the detector portions 332, 336 in the first and second gap portions 224, 226.

While the current I is shown as flowing through the current conductor 310 in a single direction in the illustrated embodiment, it should be appreciated that the current flow may be bi-directional in other embodiments. Additionally, while the first sensing element 333 and the second sensing element 337 are shown and described as provided on separate die in the illustrated embodiment, it will become apparent from figures below that the first sensing element 333 and the second sensing element 337 may be provided on a same die in some embodiments and in a same integrated circuit package in some embodiments.

Referring to FIG. 3A, in which like elements of FIGS. 2A and 3 are shown having like reference designations, a second example configuration of a current sensor 1300 according to the disclosure includes ferromagnetic core 1220 and a detector 1330. Detector 1330 has at least one first sensing element 333 disposed in first gap portion 1224 of ferromagnetic core 1220 and at least one second sensing element 337 disposed in second gap portion 1226 of ferromagnetic core 1220. Additionally, detector 1330 has at least one third, central magnetic field sensing element 1333 disposed between the first and second sensing elements 333, 337. In some embodiments, the three sensing elements 333, 337, and 1333 are coupled for differential magnetic field sensing, with central element 1333 used in both channels of the differential magnetic field sensing arrangement.

In some embodiments, the detector 1330 may take the form of an integrated circuit. Additionally, in some embodiments the first sensing element 333, the second sensing element 337, and the third sensing element 1333 are each supported by a single die 1331.

The first sensing element 333 and the second sensing element 337 are each responsive to magnetic fields generated in their respective gap portions (e.g., in response to a current I through a current conductor 310 disposed in opening 222 of ferromagnetic core 1220) to generate magnetic field signals indicative of the magnetic fields in the gap portions. Additionally, third sensing element 1333 is responsive to a magnetic field (e.g., a third magnetic field) generated between the first and second gaps portions 1224, 1226 to generate a magnetic field signal indicative of the magnetic field. Depending upon a position of the third sensing element 1333, the third sensing element 1333 may sense varying magnetic fields. For example, in embodiments when the third sensing element 1333 is positioned proximate to the first sensing element 333 in first gap portion 1224, the third sensing element 1333 may sense a transition, which may include a peak, of the magnetic field generated in the first gap portion 1224. Additionally, in embodiments in which the third sensing element 1333 is positioned substantially equidistantly between the first sensing element 333 and the second sensing element 337, the third sensing element 1333 may be calibrated to sense "interfering" magnetic fields (i.e., magnetic fields which are not related to the current to be sensed) which may be generated between the first and second gap portions 1224, 1226.

Further, in embodiments in which the third sensing element 1333 is provided as a sensing element having a different axis of maximum sensitivity than the first sensing element 333 and/or the second sensing element 337, and is provided within or proximate to a same gap portion as one of the sensing elements to which it has a different axis of maximum sensitivity, a combination of magnetic field signals generated by of the third sensing element 1333 and the other sensing element may be used by circuitry to determine a current I through the current conductor 310. Such may, for example, provide for a more precise current measurement due to the multiple magnetic field dimensions being sensed by the sensing elements.

Circuitry (e.g., circuits 510, 530 shown in FIG. 5A, as will be discussed) may be coupled to receive the magnetic field signals from respective outputs of the first, second, and third sensing elements 333, 337, 1333 and configured to generate an output of the current sensor 1300 (i.e., a current sensor output signal) indicative of the current I through the current conductor 310. In a differential sensing arrangement, for example, the current sensor output signal may be indicative of outputs of the first sensing element 333 and the third sensing element 1333 when the current I through the current conductor is within a first current level range. Additionally, the current sensor output signal may be indicative of outputs of the second sensing element 337 and the third sensing element 1333 when the current I through the current conductor is within a second, higher current level range. Thus, similar to current sensor 300 of FIG. 3, the current sensor 1300 is configured to sense a current through the current conductor 310 within at least two current level ranges.

A sensitivity of a first detector portion including first sensing element 333 may be calibrated based on the current level range to be sensed by the first detector portion, the gap spacing of the first gap portion 1224, the spacing of the first sensing element 333 within the first gap portion 1224, and/or a sensitivity of the first sensing element 333. Additionally, a sensitivity of a second detector portion including second sensing element 337 may be calibrated based on the current level range to be sensed by the second detector portion, the gap spacing of the second gap portion 1226, the spacing of the second sensing element 337 within the second gap portion 1226, and/or a sensitivity of the second sensing element 337.

Figure 3B:
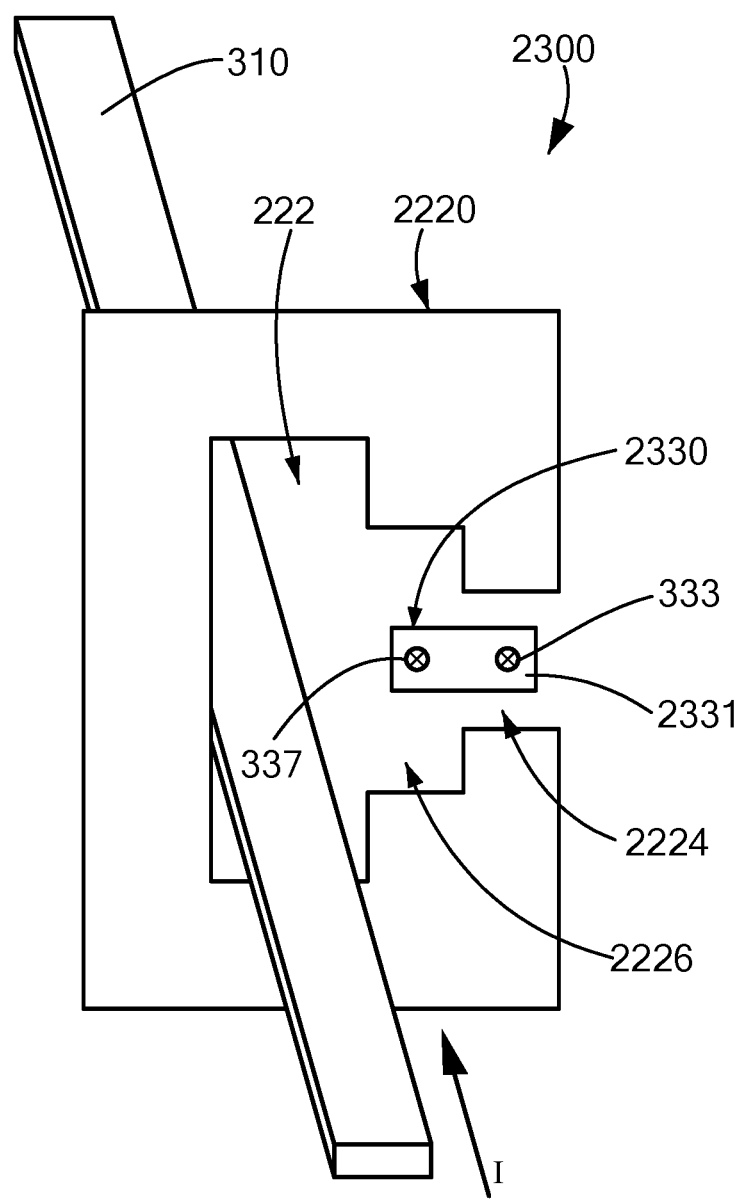
FIG. 3B is a side view of a third example current sensor including the ferromagnetic core of FIG. 2B.

Referring to FIG. 3B, in which like elements of FIGS. 2B and 3 are shown having like reference designations, a third example configuration of a current sensor 2300 according to the disclosure includes ferromagnetic core 2220 and a detector 2330. Detector 2330 has at least one first sensing element 333 disposed in first gap portion 2224 of ferromagnetic core 2220 and at least one second sensing element 337 disposed in second gap portion 2226 of ferromagnetic core 2220. Additionally, current conductor 310 is received in opening 222 of the ferromagnetic core 2220. In some embodiments, the detector 2330 may take the form of an integrated circuit. Additionally, in some embodiments the first sensing element 333 and the second sensing element 337 are each supported by a single die 2331.

The first sensing element 333 and the second sensing element 337 are each responsive to magnetic fields generated in their respective gap portions (e.g., in response to a current I through the current conductor 310) to generate magnetic field signals indicative of the magnetic fields in the gap portions. Additionally, circuitry (e.g., circuits 510, 530 shown in FIG. 5, as will be discussed) may be coupled to receive the magnetic field signals from respective outputs of the first and second sensing elements 333, 337 and configured to generate an output of the current sensor 2300 (i.e., a current sensor output signal) indicative of the current I through the current conductor 310. The current sensor output signal may, for example, be indicative of an output of the first sensing element 333 when the current I through the current conductor is within a first current level range. Additionally, the current sensor output signal may be indicative of an output of the second sensing element 337 when the current I through the current conductor is within a second, different current level range. In some embodiments, the second current level range may be a lower current level range than the first current level range. Thus, similar to current sensors 300 and 1300 of FIGS. 3 and 3A, the current sensor 2300 is configured to sense a current through the current conductor 310 with at least two current level ranges.

A sensitivity of a first detector portion including first sensing element 333 may be calibrated based on the current level range to be sensed by the first detector portion, the gap spacing of the first gap portion 2224, the spacing of the first sensing element 333 within the first gap portion 2224, and/or a sensitivity of the first sensing element 333. Additionally, a sensitivity of a second detector portion including second sensing element 337 may be calibrated based on the current level range to be sensed by the second detector portion, the gap spacing of the second gap portion 2226, the spacing of the second sensing element 337 within the second gap portion 2226, and/or a sensitivity of the second sensing element 337.

It should be appreciated that the current sensors 300, 1300, and 2300 described above with FIGS. 3-3B are but three of many potential configurations of current sensors in accordance with the concepts, systems, circuits and techniques described herein. As one example, at least one of the first and second sensing elements 333, 337 in current sensors 300, 1300, and 2300 can include a plurality of sensing elements. As another example, the current sensors 300, 1300, and 2300 can include more than first, second, and third sensing elements 337, 337, 2333 and be configured to sense more than two current level ranges of current through a current conductor.

Figure 4:
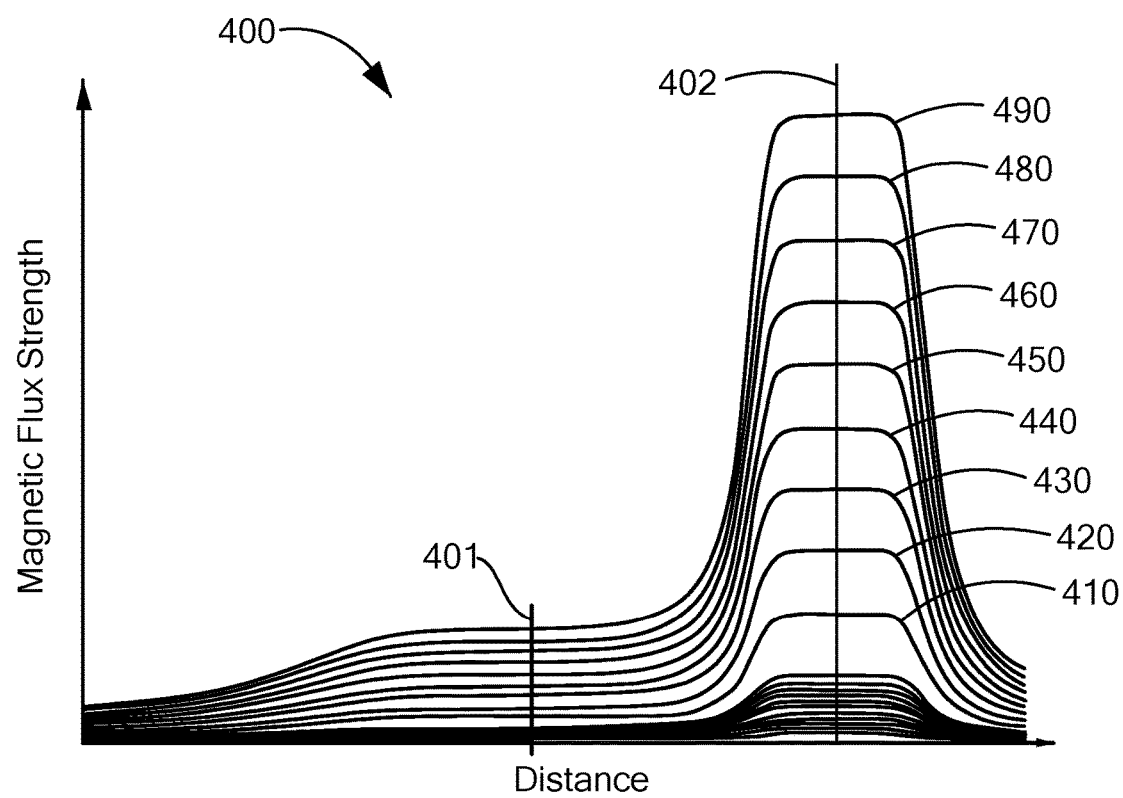
FIG. 4 shows illustrative signal waveforms of magnetic fields that may be generated in example gap portions of a ferromagnetic core according to the disclosure in response to a current through a current conductor.

Referring to FIG. 4, illustrative signal waveforms of magnetic fields that may be generated in gap portions of a ferromagnetic core (e.g., 1220, shown in FIG. 2A) are shown in a plot 400. The plot 400 has a horizontal axis with a scale in distance units and a vertical axis with a scale in magnetic field strength units. The horizontal axis may, for example, be illustrative of various positions at which a sensing element, or a plurality of sensing elements, can be disposed relative to gap portions of a ferromagnetic core. For example, a position 401 may correspond to an example position of a first sensing element (e.g., 333, shown in FIG. 3A) or a differential pair of sensing elements (e.g., 333, 1333, shown in FIG. 3A) in a first gap portion (e.g., 1224, shown in FIG. 3A). Additionally, a position 402 may correspond to an example position of a second sensing element (e.g., 337, shown in FIG. 3A) or a differential pair of sensing elements (e.g., 337, 1333, shown in FIG. 3A) in a second gap portion (e.g., 1226, shown in FIG. 3A). As previously discussed, sensing element spacing within a gap portion affects magnetic field strength sensed by the sensing element (s) and, thus, a resulting magnetic field signal generated by the sensing element(s).

The plot 400 includes a plurality of signals (e.g., 410, 420, 430, 440, 450, 460, 470, 480, 490) representative of different magnetic field strengths generated in the first and second gap portions in response to different respective currents through a current conductor. Signal 410 may, for example, be representative of a first example magnetic field generated in the gap portions in response to a first current through a current conductor disposed in an opening (e.g., 222, shown in FIG. 2A) of the ferromagnetic core. Additionally, signal 490 may be representative of a second example magnetic field generated in the gap portions in response to a second, higher current through the current conductor.

As illustrated, strengths of the magnetic fields sensed by the sensing elements vary depending on a spacing or position of the sensing element(s) within the gap portions. For example, at position 401 the magnetic fields sensed by the sensing element(s), as represented by signals 410, 420, 430, 440, 450, 460, 470, 480, 490, for example, have a first magnetic field strength. Additionally, at position 402 the magnetic fields sensed by the sensing element(s) have a second, higher magnetic field strength. Further, accuracy of the magnetic fields sensed by the sensing element(s) at each position 401, 402 and, thus, slopes of the signals 410, 420, 430, 440, 450, 460, 470, 480, 490 shown in FIG. 4, may vary based upon a number of sensing elements (e.g., one or two) sensing the magnetic fields within the gap portions.

The foregoing may, for example, be due to a first gap portion represented by position 402 having a first gap spacing and a second gap portion represented by position 401 having a second, larger gap spacing. Generally, a larger gap spacing provides for less of a concentration gain. Additionally, the foregoing may be due to a spacing of a first sensing element or a differential pair of sensing elements within the first gap portion and a spacing of a second sensing element or a differential pair of sensing elements within the second gap portion. Further, the foregoing may be due to the first sensing element(s) disposed in the first gap portion having a first output sensitivity (i.e., response characteristic to a magnetic field) and the second sensing element(s) disposed in the second gap portion having a second, different output sensitivity. It follows that the magnetic fields sensed by the sensing elements and, thus, current levels of current signals sensed by a current sensor including the sensing elements can be adjusted in multiple ways.

Figure 5:
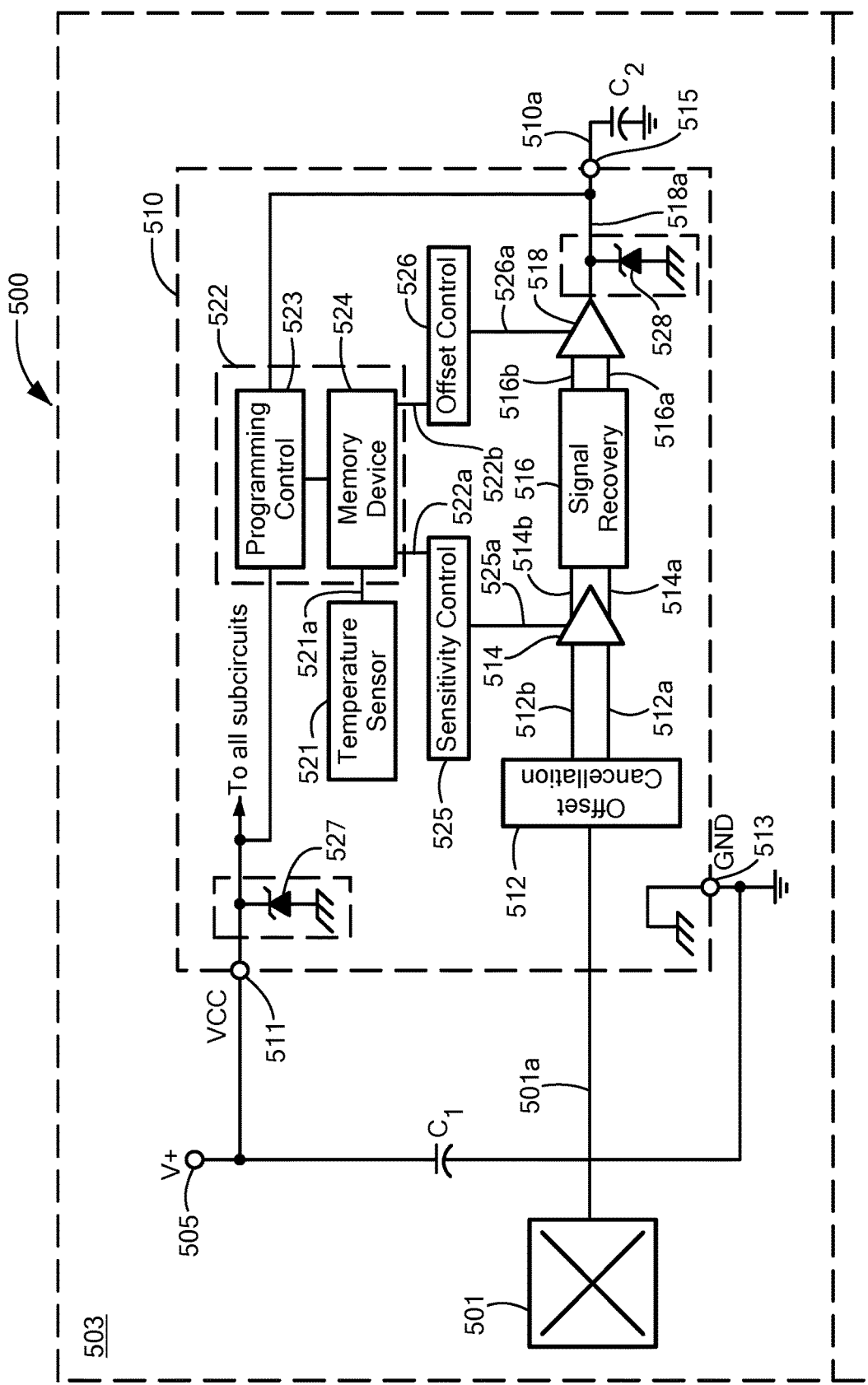
FIG. 5 shows a first example configuration of a detector according to the disclosure.
Figure 5:
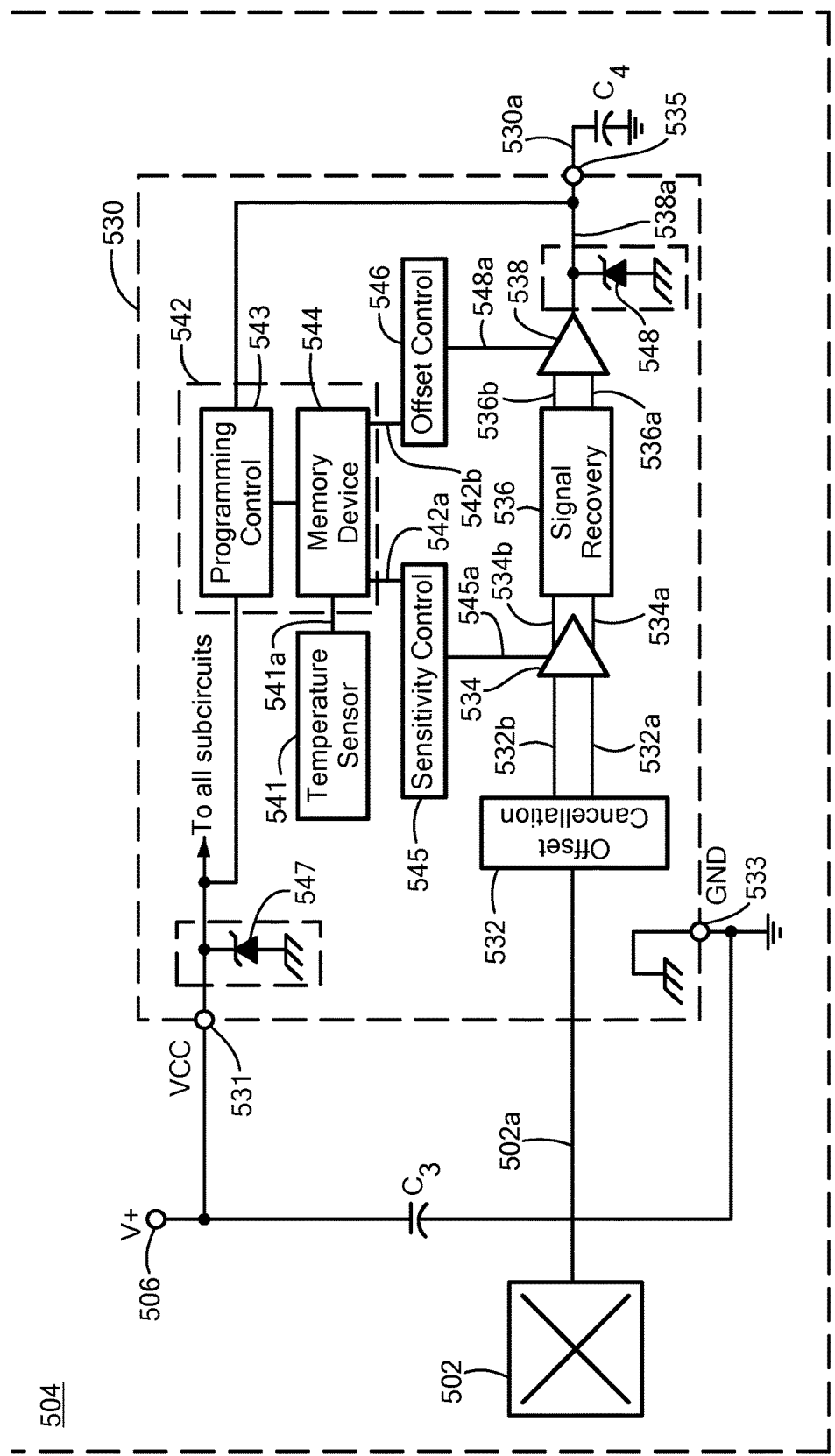

Referring to FIG. 5, a first example detector 500 which may be provided in a current sensor according to the disclosure (e.g., 1300, shown in FIG. 3A) includes at least one first magnetic field sensing element 501 and at least one second magnetic field sensing element 502, each of which may be the same as or similar to the at least one first and second magnetic field sensing elements described above in conjunction with FIGS. 1-4. The first sensing element 501 may be disposed in a first gap portion (e.g., 1124, shown in FIG. 3A) of a ferromagnetic core (e.g., 1220, shown in FIG. 3A) according to the disclosure and the second sensing element 502 may be disposed in a second gap portion (e.g., 1226, shown in FIG. 3A) of the ferromagnetic core.

The detector 500 also includes circuitry (here, circuits 510 and 530) responsive to respective outputs of first sensing element 501 and second sensing element 502 to generate output signals (here, output signals 510a, 530a) indicative of a current through a current conductor (e.g., 310, shown in FIG. 3A) disposed through a substantially central opening within the ferromagnetic core (e.g., 222, shown in FIG. 3A) and being sensed by the detector 500. Circuit 510 (i.e., a first example circuit portion) has an input coupled to an output of the first sensing element 501 and an output coupled to a corresponding output of the current sensor (not shown). Additionally, circuit 530 (i.e., a second example circuit portion) has an input coupled to an output of the second sensing element 502 and an output coupled to a corresponding output of the current sensor. In some embodiments, the detector 500 is provided in the form of an integrated circuit, with the first sensing element 501 supported by a first die 503 and the second sensing element 502 supported by a second die 504. The first die 503 and the second die 504 may be provided in a single integrated circuit package or in separate integrated circuit packages.

The first sensing element 501 (e.g., a Hall effect element) may be driven configured to generate a respective first magnetic field signal 501a in response to a first magnetic field generated in the first gap portion of the ferromagnetic core in response to a current through the current conductor. Additionally, the second sensing element 502 may be configured to generate a respective second magnetic field signal 502a in response to a second magnetic field generated in the second gap portion of the ferromagnetic core in response to the current through the current conductor. The magnetic field signals 501a, 502a may be single-ended signals or differential signals. Additionally, one of the magnetic field signals (e.g., 501a) may correspond to a so-called "high gain" signal indicative of current sensed in a first current range, and the other one of the magnetic field signals (e.g., 502a) may correspond to a so-called "low gain" signal indicative of current sensed in a second, higher current range.

The first magnetic field may have a magnitude greater than the second magnetic field and vary depending on the current through the current conductor. Additionally, the first magnetic field may vary depending on dimensions of the first gap portion and positions or a spacing of the sensing element 501 within the first gap portion, and an output sensitivity (e.g., a programmed output sensitivity) of the sensing element 501. Similarly, the second magnetic field may vary depending on dimensions of the second gap portion and positions or a spacing of the sensing element 502 within the second gap portion, and an output sensitivity of the sensing element 502. While the first and second sensing elements 501, 502 are depicted as Hall effect elements in the illustrated embodiment, in some embodiments the sensing elements are, for example, provided as other types of sensing elements, such as magnetoresistance elements or magnetotransistors. The sensing elements 501, 502 may take any form suitable for detecting a current through a current conductor by sensing first and second magnetic fields in first and second ferromagnetic core gap portions, respectively.

Circuits 510 and 530 are coupled to receive the first magnetic field signal 501a generated by the first sensing element 501 and the second magnetic field signal 502a generated by the second sensing element 502, respectively, as shown. Circuit 510 generates a detector output signal 510a indicative of the first magnetic field and of the current through the current conductor when the current is within a first current level range. Additionally, circuit 530 generates a detector output signal 530a indicative of the second magnetic field and of the current through the current conductor is within a second, high current level range.

Taking the circuit 510 as representative of each circuit 510, 530, the circuit 510 includes an offset correction circuit 512 coupled to receive the first magnetic field signal 501a (e.g., from first sensing element 501 or a sensing element pair including the first sensing element 501) and configured to generate a first offset corrected signal (here, differential signal 512a, 512b) indicative of the first magnetic field. A first amplifier 514 (e.g., a low noise amplifier) may be coupled to receive the first offset corrected signal and configured to generate a first amplified signal (here, differential signal 514a, 514b). Additionally, a signal recovery circuit (e.g., a low pass filter) 516 is coupled to receive the first amplified signal and configured to generate a filtered signal (here, differential signal 516a, 516b). Further, a second amplifier 518 is coupled to receive the filtered signal and configured to generate a second amplified signal 518a. The second amplified signal 518a is provided to a corresponding output of the circuit 510 (e.g., third terminal 515, as will be discussed) as a detector output signal 510a. The detector output signal 510a can be provided in a variety of signal formats, including, but not limited to, a SENT format, an I²C format, a PWM format, or a two-state binary format, and may be provided as a signal indicative of the first magnetic field generated in the first gap portion.

Circuit 510 also includes a temperature sensor 521, a controller 522, a sensitivity control circuit 525, and an offset control circuit 527. The temperature sensor 521 may be disposed proximate to the first sensing element 501 and configured to generate a temperature signal 521a indicative of a temperature experienced by the first sensing element 501. Additionally, the controller 522 may be coupled to receive the temperature signal 521a and configured to generate corresponding gain correction coefficients and offset correction coefficients (e.g., to compensate for temperature induced changes in sensitivity of the sensing element 501 and offset in the magnetic field signal 501a generated by the sensing element 501). The gain correction coefficients and the offset correction coefficients may be stored in a memory device 524 (e.g., onboard EEPROM), for example, based on instructions from controller logic 523 in the controller 522.

The sensitivity control circuit 525 (e.g., a programmable sensitivity control circuit) can be coupled to receive stored gain correction coefficients from memory device 524 of controller 522 via a signal line 522a and configured to control a gain level of the first amplified signal generated by the first amplifier 514 (e.g., through a gain control signal 525a) in order to thereby adjust the sensitivity of the circuit 510. Additionally, the offset control circuit 526 (e.g., a programmable offset control circuit) can be coupled to receive stored offset correction coefficients from the memory device 524 via a signal line 522b and configured to attenuate an offset of the second amplified signal 518a generated by the second amplifier 518 (e.g., through an offset control signal 526a). It follows that temperature sensor 521, a controller 522, sensitivity control circuit 525 and offset control circuit 524 may be used in circuit 510 to provide a temperature compensated output (i.e., output 510a).

Circuit 510 can also include a voltage regulator (here, represented by a Zener diode 527) coupled to a voltage source 505 at a first terminal 511 (e.g., a power terminal) of circuit 510 and configured to generate a regulated voltage as may be used to power one or more components in the circuit 510. A capacitor C1 (e.g., a bypass capacitor) can be coupled between the first terminal 511 and a second terminal 513 (e.g., a ground terminal) of the circuit 510. Additionally, an electrostatic discharge (ESD) protection circuit (here, a Zener diode 528) may be coupled proximate to the third terminal 515 (e.g., a signal terminal) of circuit 510 to provide ESD protection to the circuit 510. Further, a capacitor C2 (e.g., a load capacitor) may be coupled to the third terminal 515.

Circuit 530 is configured to generate a detector output signal 530a in a manner similar to how the circuit 510 generates the detector output signal 510a. However, since the first sensing element 501 contributes to the detector output signal 510a and the second sensing element 502 contributes to the detector output signal 530a in the embodiment shown, the detector output signal 510a is generated in response to the first magnetic field in the first gap portion and the detector output signal 530a is generated in response to the second magnetic field in the second gap portion.

In some embodiments, the detector output signals 510a, 530a may be received by circuitry (e.g., analog, digital or mixed-signal circuitry) (not shown) for further processing. For example, the detector output signals 510a, 530a may be received by an output protocol circuit (not shown) coupled to receive the first detector output signal 510a and the second detector output signal 530a and configured to generate a combined current sensor output signal. Such a combined current sensor output signal may be indicative of the first detector output signal 510a when the current through the current conductor is within a first current level range. Additionally, the current sensor output signal may be indicative of the second detector output signal 530a when the current through the current conductor is within a second, higher current level range. In embodiments in which the current sensor including the detector 500 is provided in a linear current sensor, for example, the current sensor output signal may be proportional to the current through the current conductor. The current sensor output signal may be received by other circuitry (e.g., an engine control unit), for example.

Further, in some embodiments, the current sensor including detector 500 may be a programmable current sensor and sensitivities of circuits 510, 530 (i.e., first and second detector portions) and, thus, the current sensor output, may be adjusted, or calibrated based on the current level ranges to be sensed, the gap spacings of the gap portions in which the sensing elements 501, 502 are disposed, the spacings of the sensing elements 501, 502 within the gap portions, and/or sensitivities of the sensing elements 501, 502. In one embodiment, the sensitivities of circuits 510, 530 are adjusted prior to insertion of the sensing elements 501, 502 into the gap portions. In another embodiment, the sensitivities of circuits 510, 530 are adjusted subsequent to insertion of the sensing elements 501, 502 into the gap portions. For example, the sensitivity of circuit 510 may be adjusted through a process including generating a first predetermined current through a current conductor to be sensed by the current sensor and adjusting a sensitivity of the circuit 510 (e.g., through sensitivity control circuit 525) to achieve a desired detector output signal 510a and current sensor output signal based on the first predetermined current.

With the above arrangement, the detector 500 is capable of detecting a current through a current conductor within at least two current level ranges.

While circuits 510, 530 are provided in the form of electronic circuits with analog and digital circuit portions, it will be appreciated that the particular delineation of which circuit functions are implemented in an analog fashion or with digital circuitry and signals can be varied. For example, one or more portions of the circuit 510 (e.g., offset correction circuit 512, first amplifier 514, signal recovery circuit 516, and second amplifier 518) may be provided as part of the controller 522. The controller 522 can, for example, perform the function, operation, or sequence of operations of one or more portions of the circuit 510. Additionally, some of the illustrated circuit functions can be implemented on separate circuits (e.g., additional substrates within the same integrated circuit package, or additional integrated circuit packages, and/or on circuit boards).

Additionally, while the first amplified signal, the filtered signal, and the second amplified signal are shown as differential signals in the illustrated embodiment, it should be appreciated that these signals can alternatively be single-ended signals. Similarly, while the first magnetic field signal 501*a* and the second amplified signal 518*a* are shown as single-ended signals in the illustrated embodiment, it should be appreciated that these signals can alternatively be differential signals.

Figure 5A:
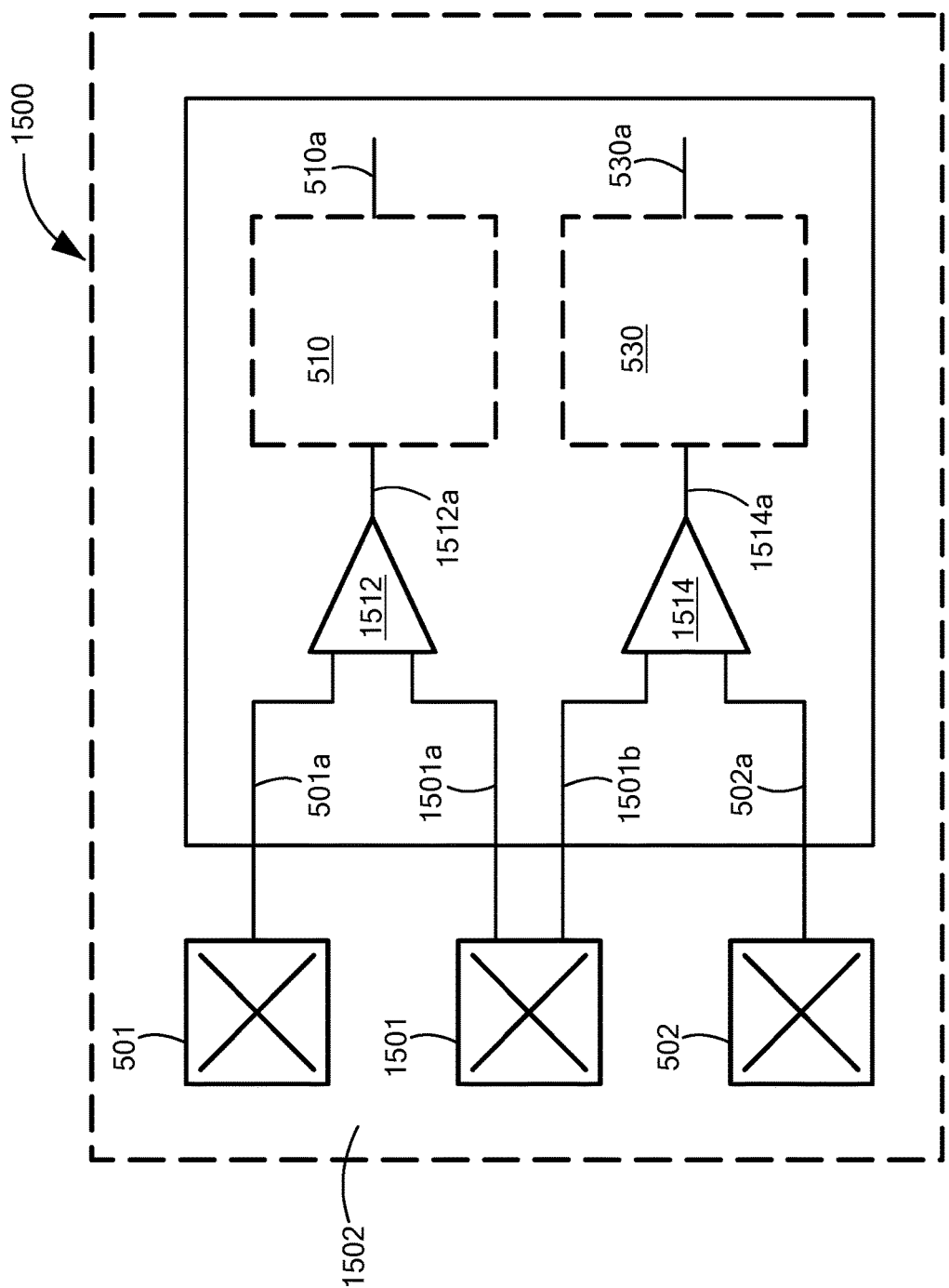
FIG. 5A shows a second example configuration of a detector according to the disclosure.

Referring to FIG. 5A, in which like elements of FIG. 5 are shown having like reference designations, another example detector 1500 for sensing a current through a current conductor includes a first sensing element 501, a second sensing element 502 and a third, central sensing element 1501 coupled in a differential sensing arrangement. The detector 1500 also includes a circuit 1510 coupled to respective outputs of the sensing elements 501, 502, 1501 and configured to generate output signals (here, detector output signals 510*a*, 510*b*) indicative of the current through the current conductor. In some embodiments, the detector 1500 may be provided in the form of an integrated circuit and the sensing elements 501, 502, 1501 may be provided on a single die 1502.

The first sensing element 501 is disposed in a first gap portion of a ferromagnetic core according to the disclosure and configured to generate a respective first magnetic field signal 501*a* in response to a first magnetic field generated in the first gap portion in response to a current through the current conductor. Additionally, the second sensing element 502 is disposed in a second gap portion of the ferromagnetic core and configured to generate a respective second magnetic field signal 502*a* in response to a second magnetic field generated in the second gap portion in response to the current through the current conductor. Further, the third sensing element 1501, which may be used as a so-called reference sensing element in the differential sensing arrangement, for example, is disposed between the first and second gap portions and configured to generate a differential magnetic field signal 1501*a*, 1501*b* in response to a third magnetic field generated in a position between the first and second gap portions. In one embodiment, detector 1500 is calibrated based upon a particular placement of the third sensing element 1501 with respect to at least one of the first sensing element 501 and second sensing element 502 (e.g., to reduce or substantially eliminate any output errors which may occur due to the placement).

In circuit 1510, a first circuit portion including an amplifier 1512 and a circuit 510 is responsive to magnetic field signals generated by first and third sensing elements 501, 1501 and a second circuit portion including an amplifier 1514 and a circuit 530 is responsive to magnetic field signals generated by second and third sensing elements 502, 1501. In particular, in the first circuit portion, amplifier 1512 (e.g., a differential amplifier) is coupled to receive a differential magnetic field signal 501*a*, 1501*a* from respective outputs of the first and third sensing elements 501, 1501 and configured to generate a first differentially sensed signal 1512*a*. Additionally, circuit 510 is coupled to receive the first differentially sensed signal 1512*a* and configured to generate a first detector output signal 510*a*. The first detector output signal 510*a* may be indicative of the first magnetic field in the first gap portion.

In the second circuit portion, amplifier 1514 is coupled to receive a differential signal 501*a*, 1501*a* from respective outputs of the second and third sensing elements 502, 1501 and configured to generate a second differentially sensed signal 1514*a*. Additionally, circuit 530 is coupled to receive the second differentially sensed signal 1514*a* and configured to generate a second detector output signal 530*a*. The second detector output signal 530*a* may be indicative of the second magnetic field in the second gap portion.

In some embodiments, the detector output signals 510*a*, 530*a* may be received by an output protocol circuit (not shown) coupled to receive the first detector output signal 510*a* and the second detector output signal 530*a* and configured to generate a current sensor output signal indicative of the current through the current conductor for at least a first current level range and a second, higher current level range. For example, the current sensor output signal may be indicative of the first detector output signal 510*a* when the current through the current conductor is within a first current level range, and the current sensor output signal may be indicative of the second detector output signal 530*a* when the current through the current conductor is within a second, high current level range.

Similar to the sensing arrangement described in FIG. 5, with the above arrangement, the detector 1500 is capable of detecting a current through a current conductor for at least two current level ranges.

While three sensing elements 501, 502, 1501 are shown in FIG. 5A, it should be appreciated that two or more sensing elements can be used. For example, in an embodiment using only two magnetic field sensing elements (e.g., 501, 502), only one sensing element (e.g., 501) can be coupled to the first amplifier 1512 and the other sensing element (e.g., 502) can be coupled to the second amplifier 1514.

Additionally, it should be appreciated that the detectors 500, 1500 described above with FIGS. 5 and 5A are but two of many potential configurations of detectors in accordance with the concepts, systems, circuits and techniques described herein. As one example, at least one of the first and second sensing elements 501, 502 in detectors 500, 1500 can include a plurality of sensing elements. As another example, the detectors 500, 1500 can include more than first, second, and third sensing elements 501, 502, 1501 and be configured to sense more than two current level ranges of a current through a current conductor.

As described above and as will be appreciated by those of ordinary skill in the art, embodiments of the disclosure herein may be configured as a system, method, or combination thereof Accordingly, embodiments of the present disclosure may be comprised of various means including hardware, software, firmware or any combination thereof.

It is to be appreciated that the concepts, systems, circuits and techniques sought to be protected herein are not limited to use in particular applications (e.g., HEV inverter, DC-to-DC converter and electric power steering (EPS) applications) but rather, may be useful in substantially any application where it is desired to sense more than one range of currents through a current conductor.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A current sensor, comprising:
a ferromagnetic core having a substantially central opening for receiving a current conductor and at least two gaps portions, each of the gap portions having an associated gap spacing; and
a detector comprising at least one first magnetic field sensing element disposed in a first one of the gap portions and configured to generate a respective first magnetic field signal in response to a first magnetic field generated in the first gap portion in response to a current through the current conductor, and at least one second magnetic field sensing element disposed in a second one of the gap portions and configured to generate a respective second magnetic field signal in response to a second magnetic field generated in the second gap portion in response to the current through the conductor, wherein the first magnetic field has a magnitude greater than the second magnetic field, wherein the detector further comprises a first circuit portion responsive to the first magnetic field signal and a second, substantially identical circuit portion responsive to the second magnetic field signal, and wherein a sensitivity of the first circuit portion is calibrated based on the spacing of the first gap portion and a sensitivity of the second circuit portion is calibrated based on the spacing of the second gap portion to be lower than the sensitivity of the first circuit portion.

2. The current sensor of claim 1, wherein the at least one first magnetic field sensing element is configured to sense a first current level range through the current conductor and wherein the at least one second magnetic field sensing element is configured to sense a second, higher current level range through the current conductor.

3. The current sensor of claim 1, wherein a spacing between the at least one first magnetic field sensing element and the at least one second magnetic field sensing element is based, at least in part, on a spacing between the first and second gap portions.

4. The magnetic field sensor of claim 1, wherein a lateral cross-section of a gap comprising the gap portions comprises a step shape or a ramp shape.

5. The current sensor of claim 1, wherein the detector further comprises circuitry responsive to the first magnetic field signal and to the second magnetic field signal to provide an output signal of the current sensor indicative of the current through the current conductor.

6. The current sensor of claim 1, wherein the at least one first magnetic field sensing element and the at least one second magnetic field sensing element comprise one or more Hall effect elements.

7. The current sensor of claim 1, wherein the at least one first magnetic field sensing element and the at least one second magnetic field sensing element comprise one or more of an anisotropic magnetoresistance (AMR) element, a giant magnetoresistance (GMR) element, a magnetic tunnel junction (MTJ) element and a tunneling magnetoresistance (TMR) element.

8. The current sensor of claim 1, wherein one of the at least one first magnetic field sensing element and the at least one second magnetic field sensing element comprises one or more Hall effect elements, and wherein the other one of the at least one first magnetic field sensing element and the at least one second magnetic field sensing element comprises one or more magnetoresistance elements.

9. The current sensor of claim 1, wherein the at least one first magnetic field sensing element and the at least one second magnetic field sensing element are supported by a single die.

10. The current sensor of claim 1, wherein the at least one first magnetic field sensing element is supported by a first die and wherein the at least one second magnetic field sensing element is supported by a second, different die.

11. The current sensor of claim 10, wherein the first die and the second die are provided in a single integrated circuit package.

12. The current sensor of claim 10, wherein the first die and the second die are provided in separate integrated circuit packages.

13. The current sensor of claim 1, wherein the detector further comprises at least one third magnetic field sensing element disposed between the at least one first magnetic field sensing element and the at least one second magnetic field sensing element and configured to generate a third magnetic field signal, and wherein the detector further comprises a first circuit portion responsive to the first and third magnetic field signals to generate a first differential magnetic field signal, and a second circuit portion responsive to the second and third magnetic field signals to generate a second differential magnetic field signal.

14. A method of sensing a current through a current conductor disposed through a substantially central opening of a ferromagnetic core, the method comprising:
placing a first magnetic field sensing element in a first gap portion of the ferromagnetic core having a first gap spacing, the first magnetic field sensing element generating a first magnetic field signal in response to a first magnetic field in the first gap portion;
placing a second magnetic field sensing element in a second gap portion of the ferromagnetic core having a second gap spacing, larger than the first gap spacing, the second magnetic field sensing element generating a second magnetic field signal in response to a second magnetic field in the second gap portion;
generating a current sensor output signal with a first circuit portion in response to the first magnetic field signal when the current through the current conductor is within a first current level range; and
generating the current sensor output signal with a second circuit portion in response to the second magnetic field signal when the current through the current conductor is within a second, higher current level range, wherein the second circuit portion is substantially identical to the first circuit portion and wherein a sensitivity of the first circuit portion is calibrated based on the spacing of the first gap portion and a sensitivity of the second circuit portion is calibrated based on the spacing of the second gap portion to be lower than the sensitivity of the first circuit portion.

15. The method of claim 14, further comprising providing a sensitivity of the first circuit portion to be greater than a sensitivity of the second circuit portion.

16. The method of claim 14, further comprising providing the first magnetic field sensing element on a first die and providing the second magnetic field sensing element on a second, different die.

17. The method of claim 16, further comprising providing the first and second die in a single integrated circuit package.

18. The method of claim 16, further comprising providing the first and second die in separate integrated circuit packages.

19. A current sensor, comprising:
a ferromagnetic core having a substantially central opening for receiving a current conductor and at least two gaps portions, each of the gap portions having an associated gap spacing; and
a detector comprising at least one first magnetic field sensing element disposed in a first one of the gap portions and configured to generate a respective first magnetic field signal in response to a first magnetic field generated in the first gap portion in response to a current through the current conductor, and at least one second magnetic field sensing element disposed in a second one of the gap portions and configured to generate a respective second magnetic field signal in response to a second magnetic field generated in the second gap portion in response to the current through the conductor, wherein the first magnetic field has a magnitude greater than the second magnetic field, wherein the detector further comprises at least one third magnetic field sensing element disposed between the at least one first magnetic field sensing element and the at least one second magnetic field sensing element and configured to generate a third magnetic field signal, and wherein the detector further comprises a first circuit portion responsive to the first and third magnetic field signals to generate a first differential magnetic field signal, and a second circuit portion responsive to the second and third magnetic field signals to generate a second differential magnetic field signal.

20. A current sensor, comprising:
a ferromagnetic core having a substantially central opening for receiving a current conductor and at least two gaps portions, each of the gap portions having an associated gap spacing; and
a detector comprising at least one first magnetic field sensing element disposed in a first one of the gap portions and configured to generate a respective first magnetic field signal in response to a first magnetic field generated in the first gap portion in response to a current through the current conductor, and at least one second magnetic field sensing element disposed in a second one of the gap portions and configured to generate a respective second magnetic field signal in response to a second magnetic field generated in the second gap portion in response to the current through the conductor, wherein the first magnetic field has a magnitude greater than the second magnetic field, wherein a lateral cross-section of a gap comprising the gap portions comprises a ramp shape.

* * * * *

UNITED STATES PATENT AND TRADEMARK OFFICE
CERTIFICATE OF CORRECTION

PATENT NO. : 10,247,758 B2
APPLICATION NO. : 15/231133
DATED : April 2, 2019
INVENTOR(S) : Shaun Milano et al.

It is certified that error appears in the above-identified patent and that said Letters Patent is hereby corrected as shown below:

On the Title Page

Item (57), Abstract at Line 3, delete "gaps portions" and replace with --gap portions--

In the Specification

Column 1, Line 40, delete "gaps portions" and replace with --gap portions--

Column 5, Line 20, delete "currents sensors" and replace with --current sensors--

Column 9, Line 34, delete "form a single" and replace with --form of single--

Column 9, Line 38, delete "form the single" and replace with --form of single--

Column 10, Line 21, delete "form a single" and replace with --form of single--

Column 10, Line 36, delete "form a single" and replace with --form of single--

Column 10, Lines 66-67, delete "form a single" and replace with --form of single--

Column 11, Line 2, delete "core 3220" and replace with --core 4220--

Column 11, Line 16, delete "form a single" and replace with --form of single--

Column 11, Line 32, delete "form a single" and replace with --form of single--

Column 11, Line 49, delete "form a single" and replace with --form of single--

Column 12, Line 11, delete "form a single" and replace with --form of single--

Signed and Sealed this
Twenty-eighth Day of May, 2019

Andrei Iancu
*Director of the United States Patent and Trademark Office*

CERTIFICATE OF CORRECTION (continued)
U.S. Pat. No. 10,247,758 B2

Column 12, Line 60, delete "detector 300" and replace with --detector 330--

Column 12, Line 66, delete "supported a" and replace with --supported by a--

Column 15, Line 3, delete "gaps portions" and replace with --gap portions--

Column 15, Line 27, delete "by of the" and replace with --by the--

Column 18, Line 27, delete "driven configured" and replace with --configured--

Column 19, Line 33, delete "circuit 527" and replace with --circuit 526--

Column 23, Line 9, delete "that that scope" and replace with --that the scope--

In the Claims

Column 23, Line 17, Claim 1 delete "gaps portions" and replace with --gap portions--

Column 25, Line 13, Claim 19 delete "gaps portions" and replace with --gap portions--

Column 26, Line 12, Claim 20 delete "gaps portions" and replace with --gap portions--